(12) United States Patent
Bhatia et al.

(10) Patent No.: US 10,997,097 B2
(45) Date of Patent: May 4, 2021

(54) ENABLING HIGH SPEED COMMAND ADDRESS INTERFACE FOR RANDOM READ

(71) Applicant: Western Digital Technologies, Inc., San Jose, CA (US)

(72) Inventors: Sneha Bhatia, Bangalore (IN); Vinayak Ghatawade, Bangalore (IN)

(73) Assignee: Western Digital Technologies, Inc., San Jose, CA (US)

(*) Notice: Subject to any disclaimer, the term of this patent is extended or adjusted under 35 U.S.C. 154(b) by 29 days.

(21) Appl. No.: 16/431,511

(22) Filed: Jun. 4, 2019

(65) Prior Publication Data

US 2020/0387462 A1 Dec. 10, 2020

(51) Int. Cl.
*G06F 13/16* (2006.01)
*G11C 7/10* (2006.01)
*G06F 13/12* (2006.01)

(52) U.S. Cl.
CPC ........ *G06F 13/1689* (2013.01); *G06F 13/126* (2013.01); *G11C 7/106* (2013.01); *G11C 7/1063* (2013.01)

(58) Field of Classification Search
CPC ... G06F 13/126; G06F 13/1689; G11C 7/106; G11C 7/1063
See application file for complete search history.

(56) References Cited

U.S. PATENT DOCUMENTS

| | | | | |
|---|---|---|---|---|
| 5,625,590 A * | 4/1997 | Choi | ...................... | G11O 5/025 365/185.17 |
| 7,515,485 B2 * | 4/2009 | Lee | ........................ | G11C 16/10 365/189.05 |
| 7,549,001 B2 * | 6/2009 | Szczypinski | ......... | G11C 7/1078 710/5 |
| 8,233,327 B2 * | 7/2012 | Wang | ................. | G11C 16/3459 365/185.22 |
| 8,433,859 B2 * | 4/2013 | Chien | ................. | G06F 13/1605 711/154 |
| 8,447,917 B2 | 5/2013 | Chen et al. | | |
| 8,825,939 B2 | 9/2014 | Oh et al. | | |
| 9,417,816 B2 * | 8/2016 | Roberts | ................... | G06F 13/16 |
| 9,654,105 B2 | 5/2017 | Kim | | |
| 9,728,234 B1 * | 8/2017 | Kim | ........................ | G11C 8/06 |
| 9,874,898 B2 * | 1/2018 | Ware | .................... | G11C 7/1093 |
| 2005/0135145 A1 | 6/2005 | Lee et al. | | |
| 2008/0086590 A1 * | 4/2008 | Urabe | ................. | G06F 13/1668 711/103 |

* cited by examiner

*Primary Examiner* — Brian T Misiura
(74) *Attorney, Agent, or Firm* — Vierra Magen Marcus LLP

(57) ABSTRACT

A memory device includes a memory controller to transmit or receive input/output ("I/O") data via an I/O signal, as well as transmit command data, address data, or parameter data via another signal in parallel with transmitting or receiving the I/O data. The memory device also includes a memory module communicably coupled to the memory controller. The memory module receives the command data, address data, or parameter data from the memory controller to perform an operation.

20 Claims, 14 Drawing Sheets

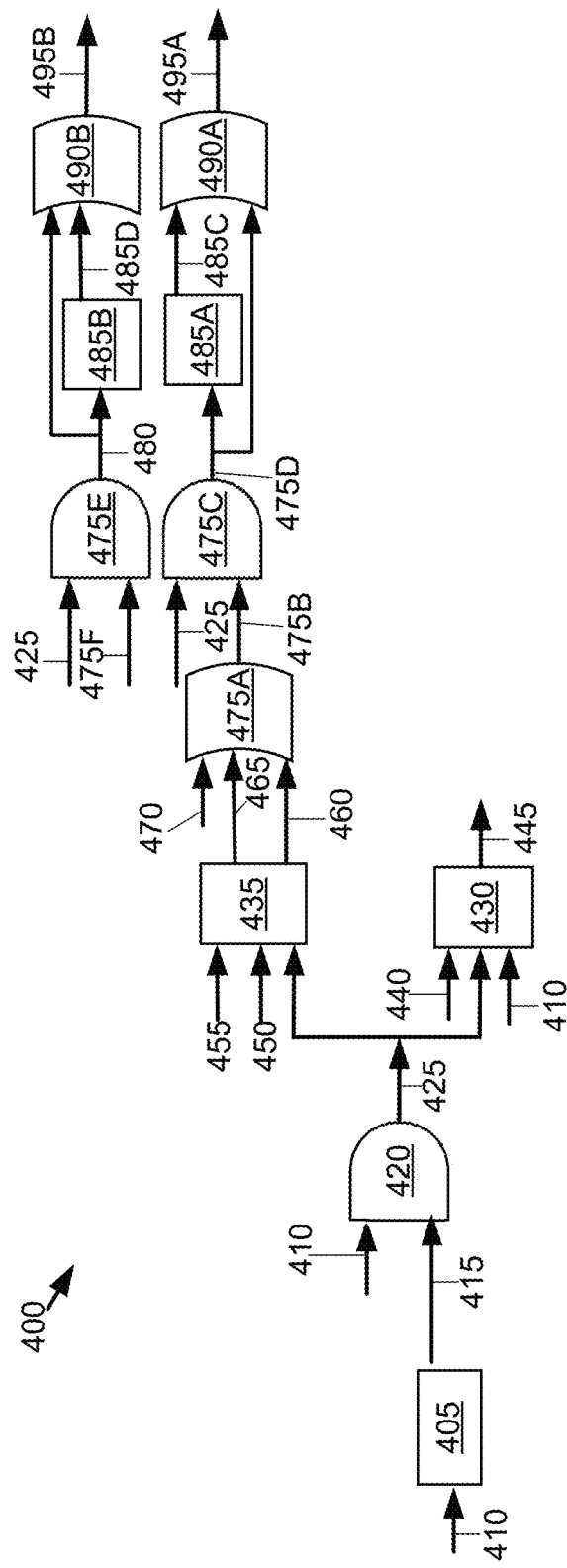

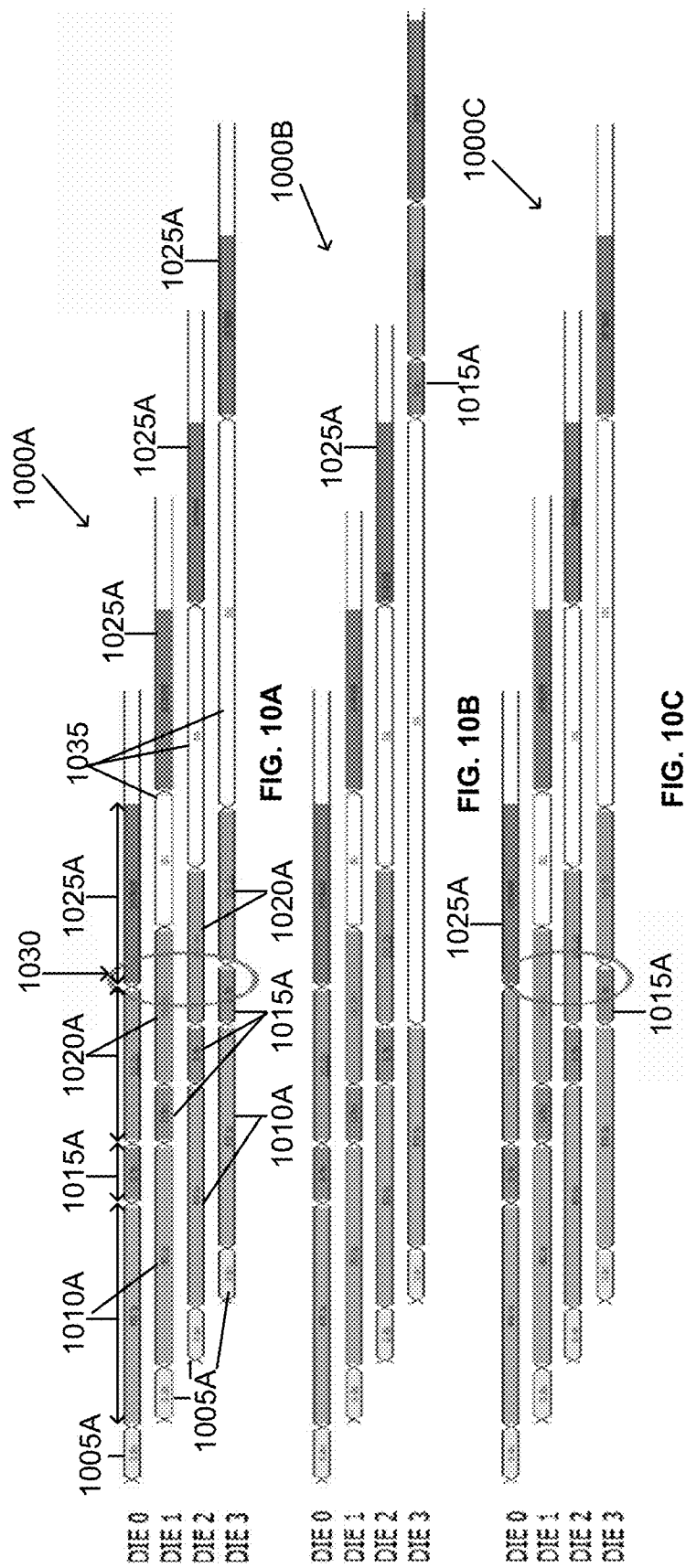

US 10,997,097 B2

ENABLING HIGH SPEED COMMAND ADDRESS INTERFACE FOR RANDOM READ

BACKGROUND

The following description is provided to assist the understanding of the reader. None of the information provided or references cited is admitted to be prior art.

Computing techniques for processing data generally require copying executable code and data from a non-volatile memory array into a volatile memory before applying the executable code to the data. The results of the processing are then returned to the non-volatile memory array. Reading information (e.g., data and executable code) from or writing information (e.g., data) to the non-volatile memory array occurs by communication between a memory controller and a memory module of the non-volatile memory array. However, the present day techniques for communication between the memory controller and the memory module have limitations.

SUMMARY

In accordance with some aspects of the present disclosure, a memory device is disclosed. The memory device includes a memory controller having programmed instructions to transmit or receive input/output ("I/O") data via an I/O signal and transmit command data, address data, or parameter data via another signal in parallel with transmitting or receiving the I/O data. The memory device also includes a memory module communicably coupled to the memory controller. The memory module receives the command data, address data, or parameter data from the memory controller to perform an operation.

In accordance with some other aspects of the present disclosure, a non-transitory computer-readable media having computer-readable instructions stored thereon is disclosed. The instructions when executed by a memory module cause the memory module to perform a process including receiving a first read command from a memory controller, transferring data to the memory controller in response to the first read command, and receiving a second read command from the memory controller in parallel with transferring the data to the memory controller.

In accordance with yet other aspects of the present disclosure, a non-transitory computer-readable media having computer-readable instructions stored thereon is disclosed. The instructions when executed by a memory controller cause the memory controller to perform a process including sending a clock signal to a memory module, and sending command data, address data, or parameter data to the memory module with respect to the clock signal. The memory controller sends at least one bit of the command data, address data, or parameter data during each pulse of the clock signal. The process also includes sending a command latch enable ("CLE") signal and an address latch enable ("ALE") signal indicating that the command data, the address data, or the parameter data is being sent and receiving input/output ("I/O") data from the memory module in parallel with sending the command data, the address data, or the parameter data to the memory module.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

FIG. 4 is an example logic block diagram of a logic block associated with the memory module of FIG. 3, in accordance with some embodiments of the present disclosure.

FIGS. 10A-10C are example timing diagrams showing an application of the embodiments of FIGS. 3-9B, in accordance with some embodiments of the present disclosure.

Figure 1:
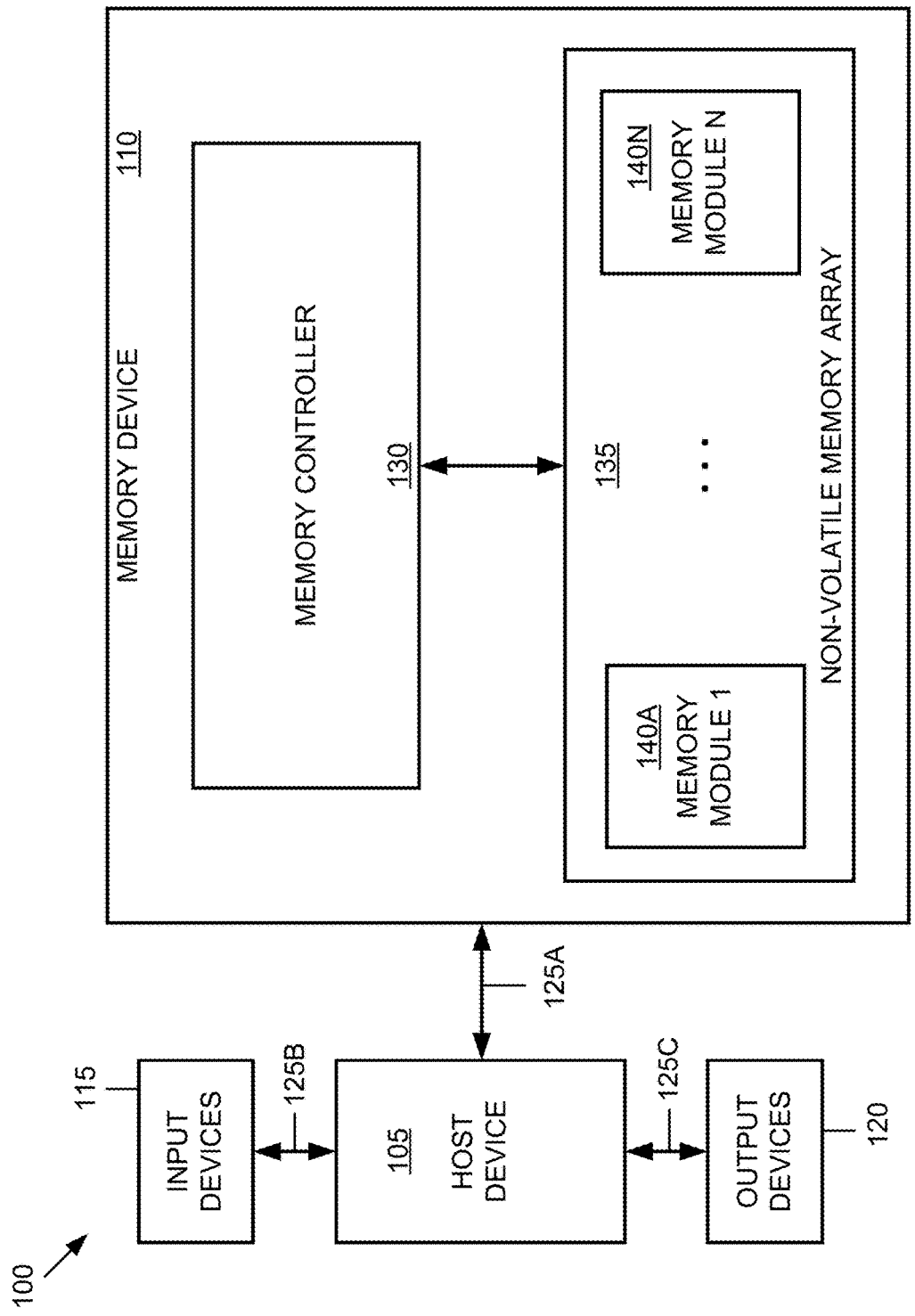
FIG. 1 is an example block diagram of a computing system, in accordance with some embodiments of the present disclosure.

The foregoing and other features of the present disclosure will become apparent from the following description and appended claims, taken in conjunction with the accompanying drawings. Understanding that these drawings depict only several embodiments in accordance with the disclosure and are therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

The present disclosure is directed to a computing system having a memory device. The memory device includes a memory controller in communication with one or more memory modules. The memory controller is configured to read data from or write data to the one or more memory modules. To communicate with a first memory module of the one or more memory modules, the memory controller and the first memory module are connected via a plurality of pads (also referred to herein as "pins") and communication buses. For example, the memory controller and the first memory module may each be connected via a Chip Enable ("CEN") pad, an Address Latch Enable ("ALE") pad, a Command Latch Enable ("CLE") pad, and an Input/Output ("I/O") pad. The pads that are transmitting information may be referred to as transmitter pads, while the pads that are receiving information may be referred to as receiver pads.

To communicate with the first memory module, the memory controller selects the first memory module by asserting a CEN signal that is transmitted from the memory controller to the first memory module via their respective CEN pads. "Asserting" a signal means making that signal active. For example, in some embodiments, the CEN signal may be an active low signal. In other words, the CEN signal may be considered to be "asserted" or active when the CEN signal is at a logical LOW level (e.g., logic level 0). On the other hand, since the CEN signal is an active low signal, the CEN signal may be considered "disabled" when the CEN signal is at a logical HIGH level (e.g., logic level 1). Similarly, for active high signals, those signals are "asserted" when they are at a logic HIGH level (e.g., logic level 1) and "disabled" when they are at a logic LOW level (e.g., logic level 0).

In addition to asserting the CEN signal, the memory controller asserts an ALE signal and a CLE signal to send address and command control signals to the first memory module via their respective ALE and CLE pads. The address and command control signals may be indicative of an operation that the memory controller desires the first memory module to perform. For example, to perform a read operation for reading data from the first memory module, the command and address control signals may include a read command, and to perform a write operation, the command and address control signals may include a write command. The first memory module does not respond to control signals from the memory controller until the CEN signal is asserted. The first memory module starts responding to the control signals received from the memory controller after the CEN signal is asserted. Thus, when the first memory module receives the asserted CEN signal, the first memory module starts responding to the ALE and CLE control signals.

The CLE/ALE control signals form the command/address path of the first memory module. The command/address path operates at a lower frequency (e.g., a write cycle time of about 20 nanoseconds and 50 MHz) compared to data transfer speeds. Sending the CLE/ALE control signals also requires the memory controller to send corresponding command and address data, respectively, to the first memory module. The command/address data may be sent from the memory module to the first memory module on an I/O signal via respective I/O pads. The I/O signal is also used to facilitate I/O data transfer between the first memory module and the memory controller. For example, for a write command to write data to the first memory module, the memory controller may send I/O data to the memory module via the I/O signal. Similarly, for a read command, the memory controller may receive the data being read from the first memory module via the I/O signal. Thus, the I/O signal is used for transmitting both—I/O data and command/address codes. In some embodiments, parameter data may also be sent through the I/O signal. Although the I/O signal is used for transmitting I/O data, command data, address data, and parameter data, at a given time, only one of those types of data may be sent on the I/O signal.

The I/O signal may be split within two distinct paths within the first memory module. The first of the two distinct paths may include a data path where I/O data is sent to be written to the first memory module or received from the first memory module for transmitting to the memory controller. The second of the two distinct paths may include a decoding path that decodes the command/address control signals, the parameter data, and the command/address data to read or write data. Data transfer speeds (e.g., transferring I/O data between the memory controller and the first memory module) have been constantly increasing, while command/address path speeds (e.g., transferring command/address/parameter data to the first memory module) have largely remained stagnant. The command/address path speeds may become a bottleneck, particularly in those applications that require reading or writing a burst of data (e.g., video, real time imaging, etc.). Without increasing the command/address path speeds, the speed with which data operations may be performed is ultimately limited regardless of how fast the data may be read from or written into the first memory module. However, even increasing the command/address path speeds would not increase the overall throughout that much because the I/O data and the command/address/parameter data use the same I/O signal for transmission, and only one of those types of data may be sent via the I/O signal.

Accordingly, the present disclosure provides technical solutions for increasing the overall throughput by enabling parallelism in the transmission of I/O data and the command/address/parameter data. By being able to transmit the I/O data in parallel with the command/address/parameter data, the memory controller is able to send commands simultaneously with reading/writing data, without having to wait for I/O signal to be free. Thus, the present disclosure provides two embodiments for enabling parallelism in transmission of I/O data and command/address/parameter data. The first embodiment includes providing a new data latch enable ("DLE") pad on the memory controller and the first memory module. The DLE pad may be used to transmit the command/address/parameter data via a DLE signal, while the I/O signal may be used to transmit I/O data. Thus, the I/O data may be transmitted in parallel with the command/address/parameter data. In some embodiments, the memory controller may send the command/address/parameter data via the DLE signal serially in one bit increments with respect to a clock signal. The first memory module may receive the serial data from the DLE signal and convert the serial data into parallel data after a number of clock pulses have passed. For example, when the command/address/parameter data includes eight bit data, each bit of the command/address/parameter data may be sent during one pulse of the clock signal. The first memory module may count eight pulses of the clock signal and convert the serial data received in the previous eight pulses to a parallel data. The parallel data is indicative of the command/address/parameter data, which the first memory module may use to perform an operation (e.g., a read or write operation).

The second embodiment includes sending the command/address/parameter data on the CLE and ALE signals that also sends the command/address control signals. The CLE and ALE signals may include a header portion that is indicative of the command/address/parameter data control signals. The first memory module may decode the header portion to determine whether the information received on the CLE signal and the ALE signal after the header portion is command data or address data or parameter data. By using the CLE and ALE signals for sending the command/address/parameter data, extra pads are not needed on the memory controller and the first memory module.

Advantageously, sending command/address/parameter data and I/O data in parallel reduces data access time, thereby increasing overall system throughout. For applications like low latency flash in which the total read time (tRead) has reduced significantly (e.g., from 55 microseconds to 5 microseconds), the time needed to transfer the command/address/parameter data becomes a major bottleneck. By sending the command/address/parameter data in parallel with the I/O data, at least some of the time needed to transmit the command/address/parameter data may be shielded within the I/O data transfer time, thereby increasing throughput. In some embodiments, a four-die read operation on a low latency flash with a tRead time of about five microseconds may take a total of about 29,320 nanoseconds for reading data from the four dies instead of about 29,320 nanoseconds, thereby increasing performance by about 0.71%. Other memory applications may also benefit from shielding at least some of the command/address/parameter data transfer time within I/O data transfer time.

Further, in some embodiments, calibration time may be shielded within I/O data transfer time. As data transfer speed increases, various calibration sequences are needed to be run on the first memory module to maintain performance. These calibration sequences (e.g., ZQ calibration) may be sent as commands to the first memory module by the memory controller. The calibration sequences may be sent in parallel with the I/O data transfer, thereby shielding the calibration time. In some embodiments, running the calibration sequence in parallel with I/O data transfer may reduce the total operation time to about 11,270 nanoseconds from about 14,280 nanoseconds, thereby increasing performance by about 21%.

Referring now to FIG. 1, an example block diagram of a computing system 100 is shown, in accordance with some embodiments of the present disclosure. The computing system 100 includes a host device 105 associated with a memory device 110. The host device 105 may be configured to receive input from one or more input devices 115, and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, etc.), tablets, personal digital assistants, mobile devices, wearable computing devices such as smart watches, other handheld or portable devices, or any other computing unit suitable for performing operations using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user, to enter information (e.g., data) into the host device and send instructions to the host device. Similarly, the output devices 120 may include a variety of output technologies such as external memories, printers, speakers, displays, microphones, light emitting diodes, headphones, plotters, speech generating devices, video devices, global positioning systems, and any other output peripherals that are configured to receive information (e.g., data) from the host device 105. The "data" that is either input into the host device 105 and/or output from the host device may include any of a variety of textual data, graphical data, video data, sound data, position data, combinations thereof, or other types of analog and/or digital data that is suitable for processing using the computing system 100.

Although not shown, the host device 105 may include one or more processing units that may be configured to execute instructions for running one or more applications. In some embodiments, the instructions and data needed to run the one or more applications may be stored within the memory device 110. In such cases, the host device 105 may request the memory device 110 to retrieve the data and instructions, which may then at least temporarily be stored within a memory on the host device. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

The memory device 110 includes a memory controller 130 that may be configured to read data from or write data to a non-volatile memory array 135. The non-volatile memory array 135 may include one or more memory modules such as memory modules 140A-140N. Each of the memory modules 140A-140N may include any of a variety of non-volatile memory types. For example, in some embodiments, one or more of the memory modules 140A-140N may include NAND flash memory cores. In other embodiments, one or more of the memory modules 140A-140N may include NOR flash memory cores, Static Random Access Memory (SRAM) cores, Dynamic Random Access Memory (DRAM) cores, Magnetoresistive Random Access Memory (MRAM) cores, Phase Control Memory (PCM) cores, Resistive Random Access Memory (ReRAM) cores, 3D XPoint memory cores, ferroelectric random-access memory (FeRAM) cores, and other types of memory cores that are suitable for use within the non-volatile memory array 135.

The memory modules 140A-140N may be individually and independently controlled by the memory controller 130. In other words, the memory controller 130 may be configured to communicate with each of the memory modules 140A-140N individually and independently. As discussed in greater detail below, the memory modules 140A-140N may remain in a standby state until the memory controller 130 desires to establish communication with one of the memory modules by generating a chip select or chip enable signal. The memory controller 130 may be configured as a logical block or circuitry that receives instructions from the host device 105 and performs operations in accordance with those instructions. For example, the memory controller 130 may be configured to read data from or write data to one or more of the memory modules 140A-140N in response to instructions received from the host device 105. The memory controller 130 may be situated on the same die as the non-volatile memory array 135 or on a different die.

It is to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 130 and the non-volatile memory array 135, may include other hardware, software, and/or firmware components that are considered necessary or desirable in performing the functions described herein.

Figure 2:
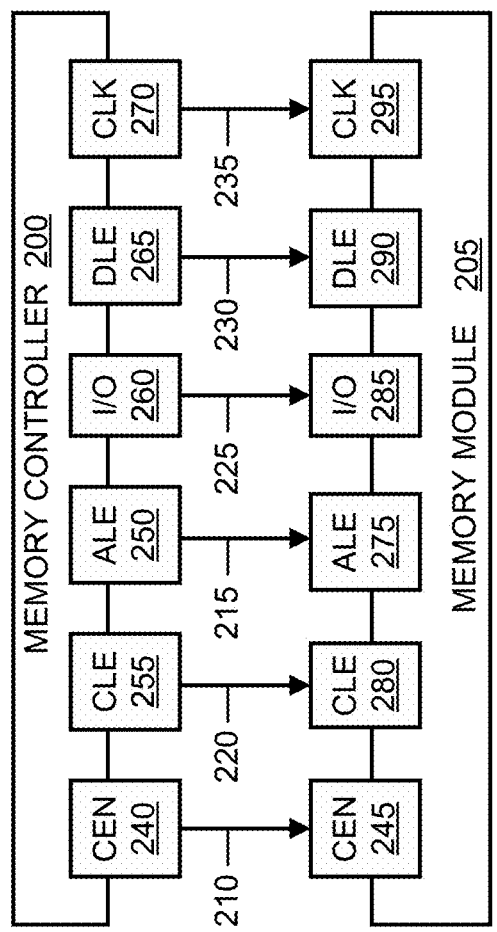
FIG. 2 is an example block diagram showing a memory controller and a memory module of the computing system of FIG. 1 in greater detail, in accordance with some embodiments of the present disclosure.

Turning now to FIG. 2, a memory controller 200 in communication with a memory module 205 is shown, in accordance with some embodiments of the present disclosure. The memory controller 200 is similar to the memory controller 130 of FIG. 1 and the memory module 205 is similar to one of the memory modules 140A-140N of FIG. 1. Although the memory controller 200 has been shown as communicating with the memory module 205 only, it is to be understood that the memory controller is likewise configured to establish communication with each of the memory modules (e.g., the memory modules 140A-140N) in the associated non-volatile memory array (e.g., the non-volatile memory array 135). The memory controller 200 includes logic/circuitry to select one of the memory modules (e.g., the memory module 205) to perform an operation, and upon selecting the memory module, send command, address, and data information to the memory module for performing the operation. Thus, to communicate with the memory module 205, the memory controller 200 generates a plurality of signals.

For example, the memory controller 200 may generate a chip enable ("CEN") signal 210 to activate or select the memory module 205 for communication. As discussed above, the non-volatile memory array (e.g., the non-volatile memory array 135) may include a plurality of memory modules (e.g., the memory modules 140A-140N). The memory modules that are not being used may remain in a standby state to save power. In the standby state, the memory modules do not respond to any control signals from the memory controller. When a memory module is desired to be activated, the memory controller asserts a CEN signal. After asserting the CEN signal, the activated memory module starts responding to the control signals from the memory controller.

Thus, when the memory controller 200 desires to activate the memory module 205, the memory controller generates the CEN signal 210. In some embodiments, the CEN signal 210 is an active low signal, which means that the CEN signal is active or asserted at a logic LOW level (e.g., logic level 0 or low voltage (0 volt)) and inactive or disabled at a logic HIGH level (e.g., logic level 1 or high voltage (e.g., 5 volts)). Thus, when no communication is desired with the memory module 205, the CEN signal 210 may remain in a disabled state. To activate the memory module 205, the memory controller 200 may toggle the CEN signal 210 from a logic HIGH level to a logic LOW level. In other embodiments, the CEN signal 210 may be an active high signal in which the CEN signal may be active in a logic HIGH level.

The memory controller 200 may also generate an address latch enable ("ALE") signal 215 and a command latch enable ("CLE") signal 220. The ALE signal 215 is a control signal, which may be used to activate an address bus connected between the memory controller 200 and the memory module 205. The CLE signal 220 is a control signal, which may be used to activate a command bus between the memory controller 200 and the memory module 205. In some embodiments, the ALE signal 215 and the CLE signal 220 may be active high signals. In other words, in some embodiments, the ALE signal 215 and the CLE signal 220 may be asserted at a logic HIGH level and may be disabled at a logic LOW level. The combination of the logic levels of the ALE signal 215 and the CLE signal 220 may be used to indicate whether command data, address data, parameter data, or input/output ("I/O") data is being sent to the memory module 205. The I/O data may also be received from the memory module 205. In some embodiments, the logic levels of the ALE signal 215 and the CLE signal 220 may be implemented in accordance with Truth Table 1 below:

| Truth Table 1 | | |
|---|---|---|
| ALE | CLE | OPERATION |
| 0 | 0 | PARAMETER DATA |
| 0 | 1 | COMMAND DATA |
| 1 | 0 | ADDRESS DATA |
| 1 | 1 | I/O DATA |

Thus, when the memory module 205 receives the ALE signal 215 and the CLE signal 220 that are both at logic LOW levels, the memory module knows that parameter data is being sent by the memory controller 200. Parameter data is indicative of a mode of how data is latched into an I/O register of the memory module 205. Any data that is sent to the memory module 205 is latched with respect to a rising edge or a falling edge of a clock signal. In a single data rate ("SDR") mode, the data is latched on either the rising edge or the falling edge of the clock signal. In a double data rate ("DDR") mode (also referred to herein as toggle mode), the data is latched on both the rising and falling edges of the clock signal. The parameter data is indicative of which mode is used to latch the data. The parameter data is also indicative of how data transfer between the memory controller 200 and the memory module 205 occurs. For example, the parameter data may define the slew rate control, input termination, output impedance, etc. of the data transfer. By changing the parameter data, the mode may be changed. In some embodiments, the SDR mode may be used by default, and the SDR mode may be changed to the DDR mode by changing the parameter data. In other embodiments, the DDR mode may be used by default, and the DDR mode may be changed to the SDR mode by changing the parameter data.

When the memory module 205 receives the ALE signal 215 that is at a logic LOW level and the CLE signal 220 that is at a logic HIGH level, the memory module knows that the memory controller 200 is sending command data, which is latched into a command register of the memory module 205. Similarly, when the memory module 205 receives the ALE signal 215 at a logic HIGH level and the CLE signal 220 at a logic LOW level, the memory module knows that address data is being sent by the memory controller 200 and the address data is latched into an address register of the memory module. When the ALE signal 215 and the CLE signal 220 are both at a logic HIGH level, the memory module 205 understands that I/O data is to be written to the memory module or read from the memory module. The data to be written or data that is read may be latched within an I/O register of the memory module 205.

Thus, by toggling the logic levels of the ALE signal 215 and the CLE signal 220, the memory controller 200 may send address data, I/O data, command data, and/or parameter data to the memory module 205.

The memory controller 200 also generates an I/O signal 225 for sending I/O data to the memory module 205. The memory controller 200 also receives I/O data read from the memory module 205 via the I/O signal 225. The memory controller 200 further generates a data latch enable ("DLE") signal 230 for sending command data, address data, or parameter data to the memory module 205. Further, the CEN signal 210, the ALE signal 215, the CLE signal 220, the I/O signal 225, and the DLE signal 230 may be clock synchronous signals such that the state of each of those signals change or toggle with respect to a rising and/or falling edge of a clock signal based upon the SDR mode or the DDR mode being used. Thus, the memory controller 200 may generate a CLK signal 235. In some embodiments, the CLK signal 235 may be a write enable ("WEN") clock signal, particularly when a write operation is to be performed on the memory module 205. Although only the CEN signal 210, the ALE signal 215, the CLE signal 220, the I/O signal 225, the DLE signal 230, and the CLK signal 235 are discussed herein, the memory controller 200 may include additional signals that may be needed or considered desirable to facilitate communication between the memory controller 200 and the memory module 205.

In some embodiments, each of the CEN signal 210, the ALE signal 215, the CLE signal 220, the DLE signal 230, and the CLK signal 235 may be a one-bit wide signal, while the I/O signal 225 may be an eight-bit wide signal. In other embodiments, one or more of the CEN signal 210, the ALE signal 215, the CLE signal 220, the I/O signal 225, the DLE signal 230, and the CLK signal 235 may have other bit-widths. Additionally, each of the CEN signal 210, the ALE signal 215, the CLE signal 220, the I/O signal 225, the DLE signal 230, and the CLK signal 235 may be transmitted from the memory controller 200 via a first pad and received by the memory module 205 via a corresponding second pad. For example, the CEN signal 210 may be transmitted from the memory controller 200 via a first CEN pad 240 and received by the memory module 205 via a second CEN pad 245. Similarly, the ALE signal 215, the CLE signal 220, the I/O signal 225, the DLE signal 230, and the CLK signal 235 may be respectively transmitted from the memory controller 200 via a first ALE pad 250, a first CLE pad 255, a first I/O pad 260, a first DLE pad 265, and a first CLK pad 270, and received at the memory module 205 via a second ALE pad 275, a second CLE pad 280, a second I/O pad 285, a second DLE pad 290, and a second CLK pad 295, respectively. The pad that is transmitting is considered the transmitter pad, while the pad that is receiving is considered a receiving pad.

Thus, based upon instructions received from the host device (e.g., the host device 105), the memory controller 200 generates one or more control signals (e.g., the CEN signal 210, the ALE signal 215, the CLE signal 220, the I/O signal 225, the DLE signal 230, and the CLK signal 235) and transmits those control signals to the memory module 205. The memory module 205, upon receiving the control signals, performs one or more operations.

Figure 3:
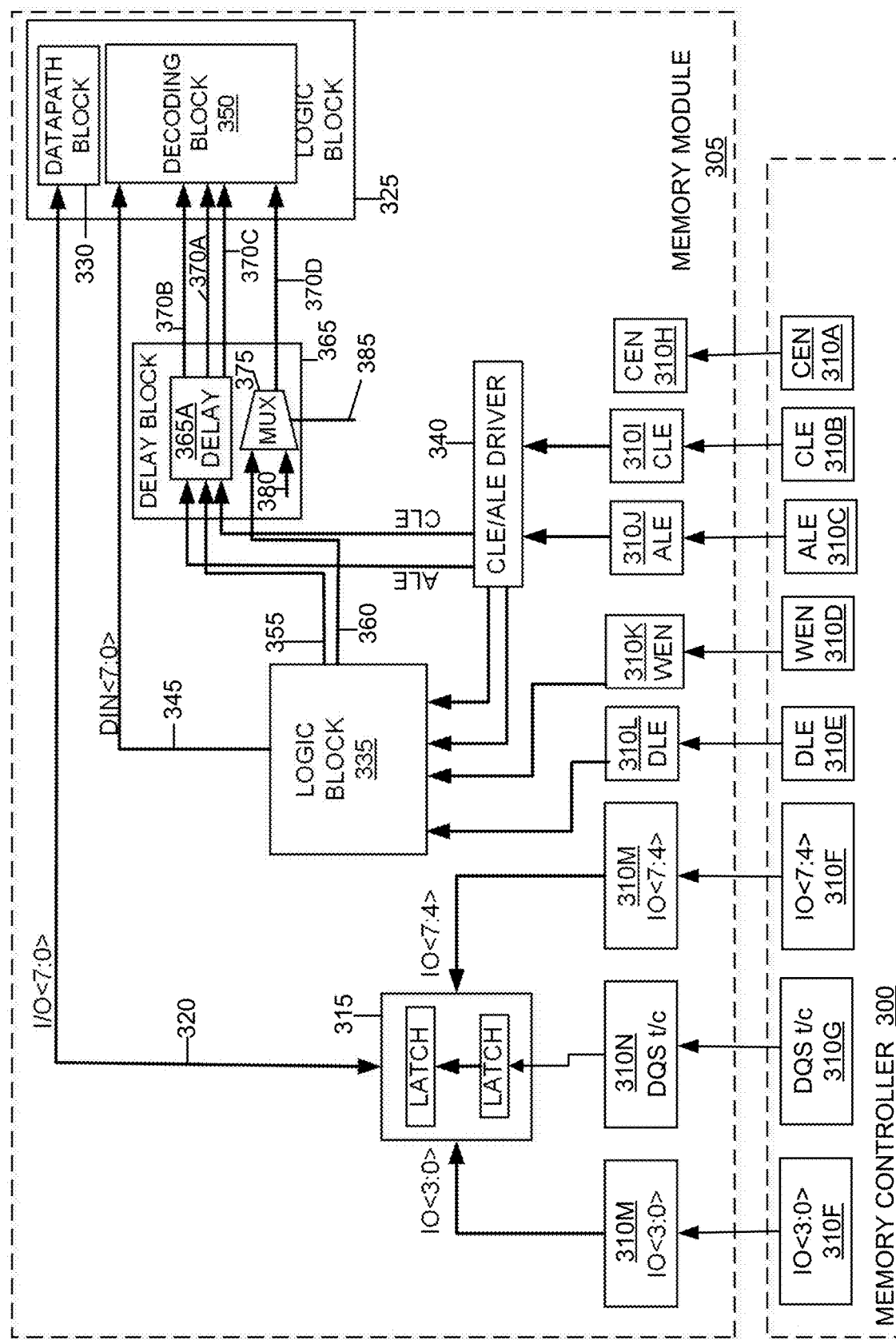
FIG. 3 is an example block diagram showing a first embodiment of a communication between the memory controller and the memory module of FIG. 2, in accordance with some embodiments of the present disclosure.

Referring to FIG. 3, an example block diagram for sending command data or address data or parameter data in parallel with I/O data between a memory controller 300 and a memory module 305 is shown, in accordance with some embodiments of the present disclosure. The command data or address data or parameter data is generally sent from the memory controller 300 to the memory module 305. The I/O data may be sent from the memory controller 300 to the memory module 305 (e.g., when the I/O data is to be written in the memory module) or from the memory module to the memory controller (e.g., when the I/O data is being read from the memory module). When the memory controller 300 desires to establish communication with the memory module 305, the memory controller asserts a CEN signal 310A. Upon asserting the CEN signal 310A, the memory controller 300 may transmit a CLE signal 310B, an ALE signal 310C, a WEN signal 310D, and a DLE signal 310E to the memory module 305. Each of these signals is sent via a respective pad on the memory controller 300. The CLE signal 310B is similar to the CLE signal 220, the ALE signal 310C is similar to the ALE signal 215, the WEN signal 310D is similar to the CLK signal 235, and the DLE signal 310E is similar to the DLE signal 230.

The memory controller 300 may also send I/O data to be written to the memory module 305 via I/O signal 310F, or receive I/O data read from the memory module via the I/O signal. The I/O signal 310F is transmitted or received via an I/O pad on the memory controller 300. Although the I/O signal 310F has been shown as being divided into two portions of four bits each for transmitting or receiving I/O data via two separate pads, in some embodiments, all of the eight bits being sent via the I/O signal may be sent via a single pad. In some embodiments, each bit of the I/O data being sent or received via the I/O signal 310F may be assigned its own pad, such that for sending or receiving an eight bit data, eight separate pads may be used. The I/O data may be sent or received in other granularities using one or more pads on the memory controller 300. The I/O data may be transferred between the memory controller 200 and the memory module 305 in synchronization with a DQS signal 310G, which is a clock signal used for transferring I/O data between the memory controller and the memory module.

The memory module 305 receives the CEN signal 310A as CEN signal 310H. Upon receiving the CEN signal 310H, the memory module 305 may generate an internal CEN signal, which may be used to activate other pads of the memory module for responding to the control signal received from the memory module. Thus, upon receiving the internal CEN signal, the memory module 305 may receive the CLE signal 310B as CLE signal 310I, the ALE signal 310C as ALE signal 310J, the WEN signal 310D as WEN signal 310K, the DLE signal 310E as DLE signal 310L, the I/O signal 310F as I/O signal 310M, and the DQS signal 310G as DQS signal 310N. The memory module 305 may receive these control signals from the memory controller 300 via pads on the memory module before diverting those signals to appropriate logic blocks within the memory module. The I/O data being sent via the I/O signal 310F and the I/O signal 310M may be sent to a latch module 315 of the memory module 305 and latched therein in synchronization with the clock of the DQS signal 310N. The latch module 315 may temporarily store the I/O data before transmitting I/O data 320 to a logic block 325, and particularly to a datapath block 330 of that logic block, for writing the I/O data within the memory module. In some embodiments, another mechanism to temporarily store the I/O data being sent via the I/O signal 310F and the I/O signal 310M may be used instead of the latch module 315. For example, in some embodiments, flip flops, buffers, registers, or other temporary storage mechanisms may be used.

Additionally, the CLE signal 310I, the ALE signal 310J, the WEN signal 310K, and the DLE signal 310L may be directed to a logic block 335 of the memory module 305. In some embodiments, the CLE signal 310I and the ALE signal 310J may be diverted to the logic block 335 via a CLE/ALE driver 340. In other embodiments, the CLE signal 310I and/or the ALE signal 310J may be directly diverted to the logic block 335. In some embodiments, either or both of the WEN signal 310K and the DLE signal 310L may also be diverted to the logic block 335 via one or more driver modules. Within the logic block 335, a sequence of bits received serially via the DLE signal 310L are converted into parallel command data, address data, or parameter data input ("DIN") 345. In some embodiments, the command data, the address data, and the parameter data may be eight bit wide. In such cases, the DLE signal 310L may serially send each bit of the command data, the address data, or the parameter data, whichever is being sent by the memory controller 300 via the DLE signal 310E. The memory module 305 may convert the serially received eight bits into one parallel eight bit data. Although the command data, the address data, and the parameter data has been described herein as being eight bit wide, in other embodiments, one or more of the command data, the address data, and the parameter data may have other bit widths.

The DIN 345 is transmitted to the logic block 325, and particularly to a decoding block 350 of that logic block to decode the command data, the address data, and the parameter data from the memory controller 300 and write the I/O data 320 into the memory module 305. Further, the logic block 335 converts the CLE signal 310I, the ALE signal 310J, and the WEN signal 310K into a form that is understood by the logic block 325. The details of the logic block 335 are discussed with respect to FIG. 4 below.

In addition to the DIN 345, the logic block 335 generates a first modified clock signal 355 for the command and address data and a second modified clock signal 360 for parameter data. The first modified clock signal 355, the second modified clock signal 360, as well as the CLE signal 310B, and the ALE signal 310C may be diverted to a delay block 365. The delay block 365 adjusts a duty cycle or pulse width of the first modified clock signal 355 and the second modified clock signal 360 within a block 365A to generate a modified CLE signal 370A, a modified ALE signal 370B, and a command/address clock 370C. A multiplexer 375 of the delay block 365 is configured to select between an internal clock 380 or the second modified clock signal 360 based upon a power on reset control signal 385 to select the parameter data that is to be used, and generate a parameter data clock 370D. For example, during start up, the multiplexer 375 may be configured to select the internal clock 380 to enable the memory module 305 to use the parameter data mode (e.g., SDR mode or DDR mode) that is selected as the default mode or was selected in a previous operation. During the current operation, if the parameter data mode is desired to switched, the multiplexer 375 may select the second modified clock 360l to enable the changing of the parameter data mode.

The modified CLE signal 370A, the modified ALE signal 370B, the command/address clock 370C, and the parameter data clock 370D are all input into the decoding block 350 of the logic block 325. Based upon the modified CLE signal 370A, the modified ALE signal 370B, the command/address clock 370C, and the parameter data clock 370D, as well as the DIN 345, the decoding block 350 enables writing of the I/O data 320 into the memory module 305. The decoding block 350 may include a plurality of latches and other decoding logic to interpret the modified CLE signal 370A, the modified ALE signal 370B, the command/address clock 370C, and the parameter data clock 370D signals.

Read operations may also be performed in a similar way. Instead of sending I/O data from the memory controller 300 to the datapath block 330, for read operations, the data being read may be transmitted from the datapath block to the memory controller following a reverse route via the I/O signal 310M and the I/O signal 310F. The data being read may be temporarily stored within the latch module 315 before being diverted to the memory controller 300.

It is to be understood that only some elements are shown in FIG. 3. However, other logic circuits and/or components that may be needed or considered desirable to have in performing the function described herein may be used in other embodiments.

Referring to FIG. 4, an example logic block diagram 400 is shown, in accordance with some embodiments of the present disclosure. The logic block diagram 400 corresponds to the logic block 335 of FIG. 3 and at least a portion of the block 365A. The logic block diagram 400 includes a counter 405 that receives a WEN signal 410 as input and generates a transition signal 415 as output. The WEN signal 410 is similar to the WEN signal 310K. The counter 405 is configured to count clock pulses of the WEN signal 410 and generate the transition signal 415 upon counting a designated number of pulses. For example, as indicated above, the DLE signal 310E and the DLE signal 310L are single bit signals that are configured to send a sequence of eight bits. In some embodiments and as explained in greater detail with respect to the timing diagrams of FIGS. 5A and 5B, each bit of the DLE signal 310L may be sent with respect to a rising edge or falling edge of a clock pulse of the WEN signal 410 in SDR mode. Thus, for sending eight bit command data or address data or parameter data via the DLE signal 310L, eight clock pulses of the WEN signal 410 are needed. Thus, upon counting the eight pulses of the WEN signal 410, the counter 405 generates the transition signal 415 indicating that eight bits of data have been received via the DLE signal 310L. The counter 405 may be implemented in any of a variety of ways that are suitable.

The transition signal 415 may be combined with the WEN signal 410 via an AND gate 420 to generate a WEN derivative ("WEND") signal 425. The WEND signal 425 is a trigger for other elements of the logic block diagram 400 to generate other signals. The AND gate 420 implements a logical conjunction on two input signals to generate one output signal. The AND gate 420 operates in accordance with Truth Table 2 below:

| Truth Table 2 | | |
|---|---|---|
| INPUT A | INPUT B | OUTPUT |
| 0 | 0 | 0 |
| 0 | 1 | 0 |
| 1 | 0 | 0 |
| 1 | 1 | 1 |

Thus, the AND gate 420 outputs a logic HIGH level (e.g., logic level "1") only when all the inputs to the AND gate are also at a logic HIGH level. If any of the inputs to the AND gate 420 is at a logic LOW level (e.g., logic level "0"), the output of the AND gate is a logic LOW level. Thus, the WEND signal 425 is at a logic HIGH level when both the WEN signal 410 and the transition signal 415 are also at a logic HIGH level, while the WEND signal is at a logic LOW level when either of the WEN signal or the transition signal is at a logic LOW level.

The WEND signal 425 is input into a serial in parallel out ("SIPO") block 430 and a flip flop 435. The SIPO block 430 also receives the WEN signal 410 and a DLE signal 440. The DLE signal 440 is similar to the DLE signal 310L. Via the DLE signal 440, the SIPO block 430 serially receives each bit that is sent via the DLE signal. Since the WEND signal 425 is generated after eight clock pulses of the WEN signal 410 and since each bit of data that is sent on the DLE signal 440 is with respect to a pulse of the WEN signal, by the time the WEND signal is generated, the SIPO block 430 has received eight bits of data from the DLE signal. Thus, upon receiving the WEND signal 425, the SIPO block 430 converts the eight bits of serially received data via the DLE signal 440 into a parallel eight bit data input ("DIN") 445. The DIN 445 is similar to the DIN 345, which is sent to the decoding block 350 of the logic block 325. In some embodiments, the SIPO block 430 may be a sequence of shift registers. In other embodiments, the SIPO block 430 may be implemented in other ways to receive a sequence of one bit data and convert all the bits into one parallel data.

The flip flop 435 also receives the WEND signal 425. The flip flop 435 may be used to latch the last received ALE/CLE signal. Thus, the flip flop 435 receives an ALE signal 450 and a CLE signal 455, and latches those signals when the WEND signal 425 is toggled. The ALE signal 450 and the CLE signal 455 are similar to the ALE signal 310I and the CLE signal 310I, respectively. The flip flop 435 receives the ALE signal 450 and the CLE signal 455, and generates a derivative ALE signal 460 and a derivative CLE signal 465. The derivative ALE signal 460 and the derivative CLE signal 465 have the same values as the ALE signal 450 and the CLE signal 455, respectively. For example, if the ALE signal 450 is at a logic HIGH level and the CLE signal 455 is at a logic LOW level when input into the flip flop 435, the derivative ALE signal 460 is also at a logic HIGH level and the derivative CLE signal 465 is also at a logic LOW level. The flip flop 435 may be implemented in any of a variety of ways that is suitable.

The derivative ALE signal 460, the derivative CLE signal 465, and a parameter data signal 470 are input into a logic OR gate 475A. The OR gate 475A generates an output signal 475B that enables generation of a clock signal for the logic block 325 only when command data, address data, or parameter data are to be sent to that logic block. The OR gate 475A implements a logical disjunction on three input signals to generate one output signal. The OR gate 475A may operate in accordance with Truth Table 3:

| Truth Table 3 | | | |
|---|---|---|---|
| INPUT A | INPUT B | INPUT C | OUTPUT |
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 1 |

Thus, the OR gate 475A generates a logic HIGH level (e.g., logic level "1") output when at least one of the inputs are at a logic HIGH level, and generates a logic LOW level (e.g., logic level "0") when all of the inputs are at logic LOW levels. Therefore, the output signal 475B is at a logic HIGH level when at least one of the derivative ALE signal 460, the derivative CLE signal 465, or the parameter data signal 470 are at a logic HIGH level. The output signal 475B is at a logic LOW level when all of the derivative ALE signal 460, the derivative CLE signal 465, and the parameter data signal 470 are at a logic LOW level.

The output signal 475B is input into a logic AND gate 475C along with the WEND signal 425. The AND gate 475C is implemented using the Truth Table 2 above. Thus, when the WEND signal 425 is toggled and when command data, address data, or parameter data are being sent to the logic block 325 indicative by the output signal 475B being at a logic HIGH level, the AND gate 475C generates a first modified clock signal 475D. The first modified clock signal 475D is similar to the first modified clock signal 355. The WEND signal 425 is also input into a logic AND gate 475E along with a parameter data signal 475F. The AND gate 475E, which is implemented in accordance with the Truth Table 2 above, generates a second modified clock signal 480 when the WEND signal 425 and the parameter data signal 475F are both at logic HIGH levels. The second modified clock signal 480 is similar to the second modified clock signal 360.

The first modified clock signal 475D may be transmitted to a delay block 485A and the second modified clock signal 480 may be transmitted to a delay block 485B. The delay block 485A and the delay block 485B may be used to increment a pulse width of the first modified clock signal 475D and the second modified clock signal 480, respectively. The delay block 485A increases the pulse width of the first modified clock signal 475D to generate a first increased width signal 485C, while the delay block 485B increases the pulse width of the of the second modified clock signal 480 to generate a second increased width signal 485D. The first increased width signal is input into an OR gate 490A along with the first modified clock signal 475D to generate a first modified signal 495A. Similarly, the second increased width signal 485D is input into an OR gate 490B along with the second modified clock signal 480 to generate a second modified signal 495B. The OR gate 490A and the OR gate 490B are implemented in accordance with Truth Table 3 above, but with two inputs instead of three.

Further, the delay block 485A, the delay block 485B, the OR gate 490A, and the OR gate 490B are similar to the block 365A. In some embodiments, the delay block 485A, the delay block 485B, the OR gate 490A, and the OR gate 490B may be combined into a single delay block, as shown in FIG. 3 with respect to the block 365A. Further, the delay block 485A, the delay block 485B, the OR gate 490A, and the OR gate 490B may be part of the logic block 335, as shown in FIG. 4, or be separate from that logic block, as shown in FIG. 3. The OR gates (e.g., the OR gate 490A and the OR gate 490B) are not shown in FIG. 3.

Although FIG. 4 has been described with respect to SDR mode, in some embodiments, the logic block diagram 400 may be implemented in accordance with DDR mode. In the DDR mode, the DLE signal 440 may transmit one bit of command data, address data, or parameter data on each rising edge and falling edge of the WEN signal 410. The operation of the counter 405 may be modified to count an appropriate number of pulses of the WEN signal 410 based upon the bit width of the command data, the address data, or the parameter data being sent on the DLE signal 440. For example, when the command data, the address data, or the parameter data that is being sent on the DLE signal 440 is eight bits wide, in the DDR mode, the counter 405 may be configured to count four pulses (since two bits are received on each pulse) of the WEN signal 410 before toggling the transition signal 415. Further, although the DLE signal 440 has been described as being one bit wide, in other embodiments, the DLE signal 440 may be configured to send more than one bit of data at a time. The operation of the counter 405 may be modified based upon the number of pulses needed to send all of the bits of the command data, the address data, or the parameter data that is being sent on the DLE signal 440.

Figure 5A:
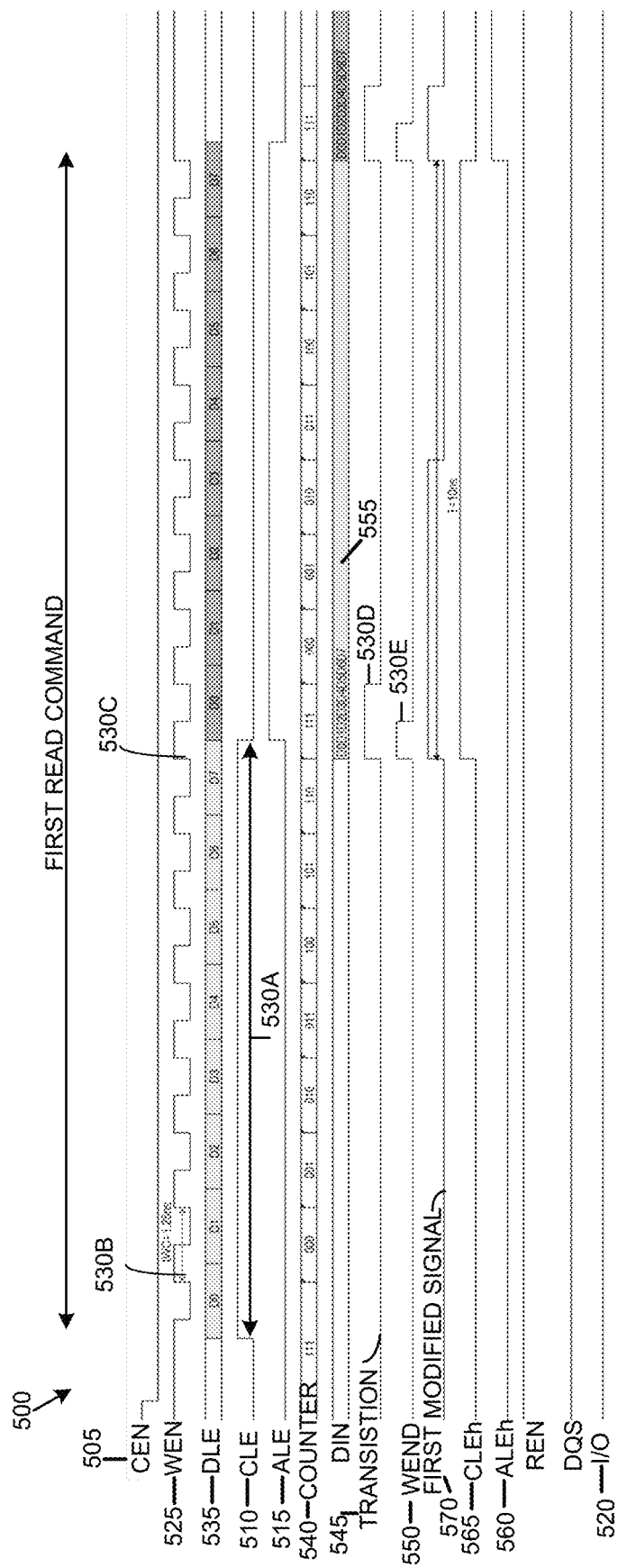
FIGS. 5A and 5B are example timing diagrams showing communication between the memory controller and the memory module of FIGS. 2-4, in accordance with some embodiments of the present disclosure.
Figure 5B:
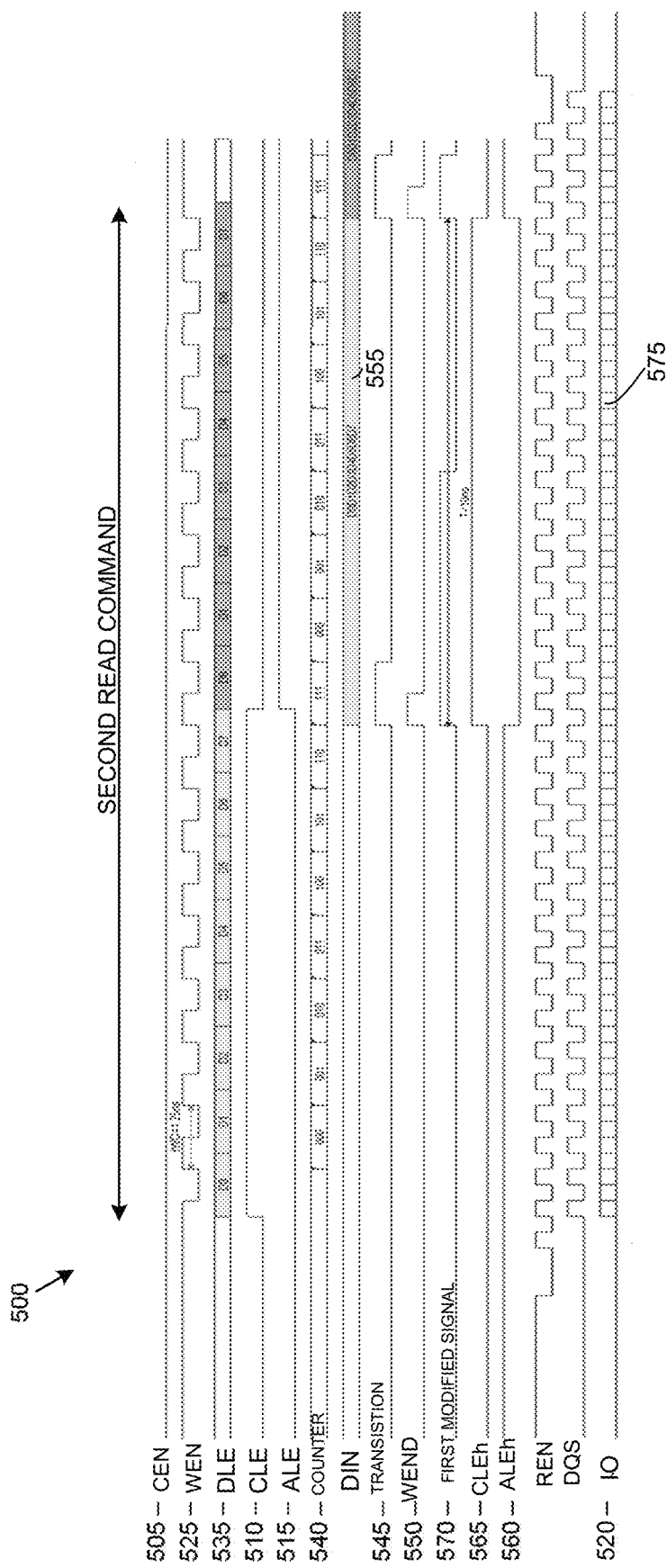

Turning now to FIGS. 5A and 5B, a timing diagram 500 is shown, in accordance with some embodiments of the present disclosure. The timing diagram 500 is implemented by the elements of the logic block diagram 400 of FIG. 4. Thus, the timing diagram 500 is discussed in conjunction with FIG. 4. Further, FIGS. 5A and 5B show portions of the timing diagram 500. Thus, the timing diagram portion shown in FIG. 5B is a continuation of the timing diagram portion in FIG. 5A. The timing diagram 500 has been split into the timing diagram portions simply for legibility. The timing diagram 500 includes a CEN signal 505, a CLE signal 510, an ALE signal 515, an I/O signal 520, and a WEN signal 525. In some embodiments, each of the CEN signal 505, the CLE signal 510, the ALE signal 515, and the WEN signal 525 may be one bit wide signals, while the I/O signal 520 may be eight bits wide. The WEN signal 525 is a clock signal that is received by the memory module (e.g., the memory module 205) from the memory controller (e.g., the memory controller 200) to write data to an address of the memory module. In some embodiments, the WEN signal 525 is an active low signal. Further, the timing diagram 500 is shown according to an SDR mode in which various transitions discussed below are with respect to a rising edge of the WEN signal 525. In some embodiments, the various transitions may be with respect to the falling edge of the WEN signal 525 in an SDR mode. Alternatively, the timing diagram 500 may be modified for a DDR mode in which the transitions occur at the rising and the falling edge of the WEN signal 525 doubling throughput relative to the SDR mode.

To activate a memory module, the memory controller asserts a CEN signal, which the memory module receives as the CEN signal 505. Since the CEN signal 505 is an active low signal, the CEN signal is at a logic HIGH level by default. When a memory module is desired to be activated, the memory controller toggles the CEN signal, which in turn toggles the CEN signal 505 to a logic LOW level. The CEN signal 505 remains in the logic LOW level until the operation being performed in the memory module is complete. Once the operation being performed in the memory module is complete, the memory controller toggles the CEN signal back to the default state of logic HIGH level. Upon asserting the CEN signal 505, the, the CLE signal 510 and the ALE signal 515 may be asserted.

The memory controller may send address/command/parameter data control signals via the CLE signal and the ALE signal. The memory module may receive the CLE signal from the memory controller as the CLE signal 510 and receive the ALE signal from the memory controller as the ALE signal 515. Thus, as shown in FIG. 5A, after the assertion of the CEN signal 505, the CLE signal 510 toggles to a logic HIGH level during time period 530A, while the ALE signal 515 remains at a logic LOW level during the same time period. Thus, as seen from the Truth Table 1 above, the combination of the CLE signal 510 and the ALE signal 515 is indicative of the memory controller sending a command control signal during the time period 530A. In addition to the CLE signal and the ALE signal, the memory controller starts sending command data (corresponding to the command control signal indicated by the CLE/ALE signals) to the memory module, which the memory module receives via a DLE signal 535. Conventionally, the memory controller sends command data is sent via an I/O signal, which would be received by the memory module at the I/O signal 520. By sending the command data via the DLE signal 535 instead of the I/O signal 520, the I/O signal is kept available to send/receive I/O data in parallel with the command data.

For purposes of explanation, the command control signal being sent by the memory controller via the CLE signal 510 and the ALE signal 515 is a read command. The timing diagram portion of FIG. 5A corresponds to a first read command, while the timing diagram portion of FIG. 5B corresponds to a second read command. If the timing diagram 500 were for a write command, the memory controller would send I/O data on the I/O signal 520 in FIG. 5A. However, since the timing diagram 500 is for a read command, no I/O data is sent by the memory controller. Rather, as shown in FIG. 5B, I/O data is received from the memory module by the memory controller.

The DLE signal 535 is configured to send one bit of data during each pulse of the WEN signal 525. A "pulse" of the WEN signal 525 is intended herein to mean the duration between a rising edge of the WEN signal to the next rising edge of the WEN signal. The data sent via the DLE signal 535 is latched within the SIPO block 430 after the next rising edge of the WEN signal 525. Thus, as shown, the DLE signal 535 may send a bit D0 during a pulse of the WEN signal 525, and the bit D0 may be latched into the SIPO block 430 after a rising edge 530B of the WEN signal 525. Similarly, the DLE signal 535 may latch eight bits of data in one bit increments during eight pulses of the WEN signal 525. At a rising edge 530C of the eighth pulse of the WEN signal 525, the eight serially received bits sent by the DLE signal 535 are latched in the SIPO block 430. After sending the eight bits of command data, the DLE signal 535 may start sending another command data, address data, or parameter data.

Further, a counter 540, which is similar to the counter 405, counts the eight pulses (e.g., incrementing from 000 to 111) of the WEN signal 525. At the eighth count, which corresponds to the rising edge 530C, the counter 540 toggles a transition signal 545. The transition signal 545 is similar to the transition signal 415. Thus, at the rising edge 530C, the transition signal 545 transitions to a HIGH logic level for one pulse 530D. After the one pulse 530D, the transition signal 545 toggles back to the LOW logic level and remains in the LOW logic level until the counter 540 again counts eight pulses of the WEN signal 525. The transitioning of the transition signal 545 to the logic HIGH level toggles a WEND signal 550, which is similar to the WEND signal 425. Thus, when the transition signal 545 toggles to the logic HIGH level for the one pulse 530D, the WEND signal 550 also toggles to the logic HIGH level, but for a half pulse 530E.

The toggling of the WEND signal 550 to the logic HIGH level triggers the SIPO block 430 to output the eight bits of data (D0-D7) received from the DLE signal 535 during the time period 530A as an eight bit DIN 555. The DIN 555 is similar to the DIN 445. Additionally, the toggling of the WEND signal 550 to the logic HIGH level triggers the flip flop 435 for generating a derivative ALE signal 560 and a derivative CLE signal 565. Since the ALE signal 515 and the CLE signal 510 have transitioned from their LOW and HIGH logic levels, respectively, at the rising edge 530C of the WEN signal 525, the logic levels of the ALE and CLE signals are latched and recreated by the flip flop 435 to generate the derivative ALE signal 560 and the derivative CLE signal 565. As seen from FIGS. 5A and 5B, the derivative ALE signal 560 and the derivative CLE signal 565 have the same logic levels as the ALE signal 515 and the CLE signal 510, respectively.

In addition, toggling of the WEND signal 550 to the logic HIGH level triggers the generation of the first modified clock signal 475D and the second modified clock signal 480, and generation of the first modified signal 495A and the second modified signal 495B therefrom, respectively. Only the first modified signal 495A is shown in FIGS. 5A and 5B as signal 570. The frequency of the signal 570 is equal to one eight times the frequency of the WEN signal 525. In other words, the signal 570 is equal to the duration of eight pulses of the WEN signal 525. In other words, the signal 570 has an increased pulse width relative to the WEN signal 525.

Upon sending all of the command data, parameter data, and address data for the first read command in FIG. 5A, the I/O data 575 is read and transferred out, as shown in FIG. 5B. When the I/O data 575 is being transferred out on the I/O signal 520, the memory controller may start sending another read command, which is received via the memory module via the CLE signal 510, the ALE signal 515, and the DLE signal 535, as shown in FIG. 5B. Thus, by using the DLE signal 535, at least some of the time needed to send command data, address data, and parameter data may be shielded or hidden with the time needed to send I/O data via the I/O signal 520 to increase data transfer rates, thereby increasing performance.

Figure 6:
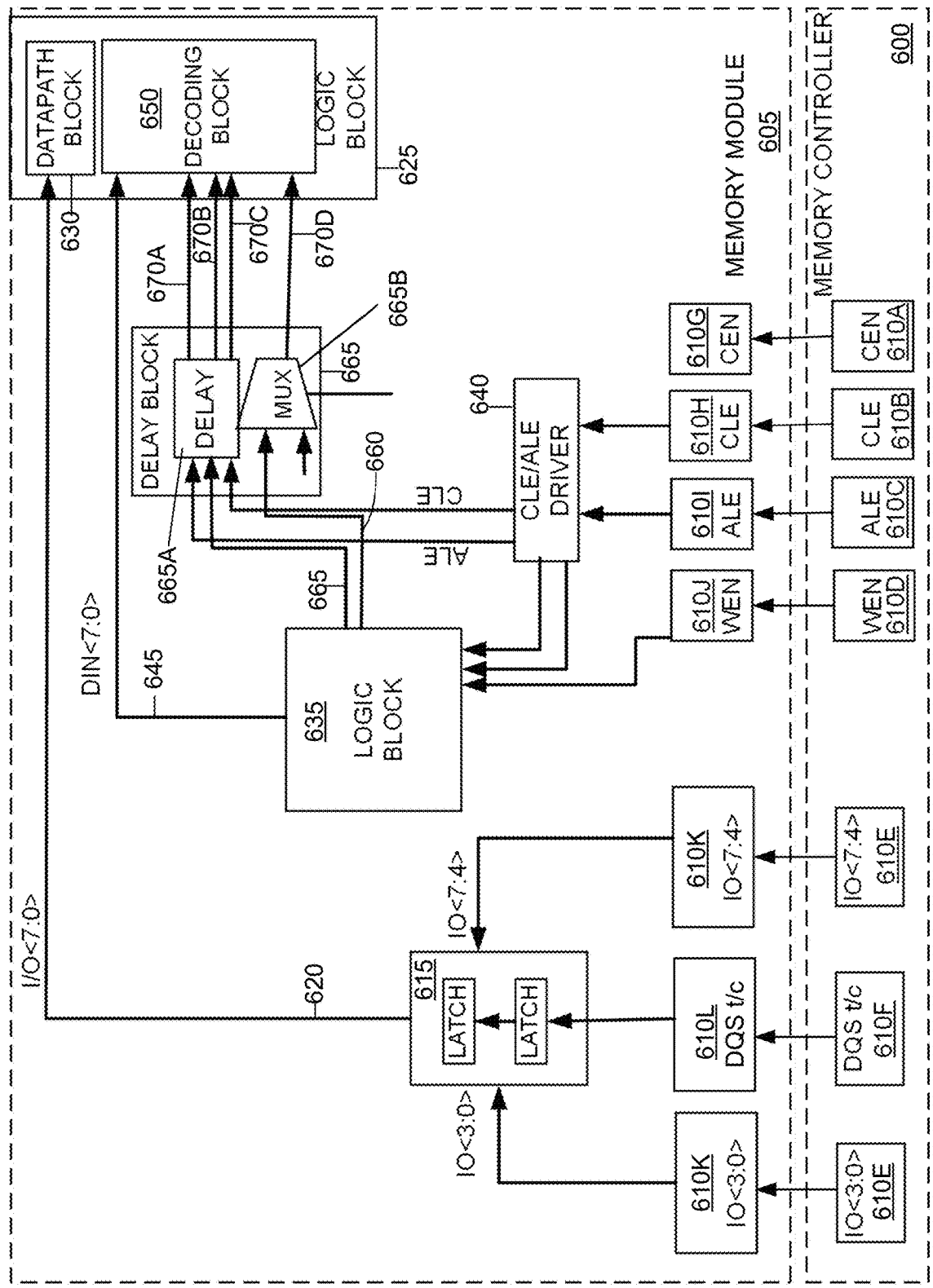
FIG. 6 is an example block diagram showing a second embodiment of a communication between the memory controller and the memory module of FIG. 2, in accordance with some embodiments of the present disclosure.

Referring now to FIG. 6, an example block diagram for facilitating communication between a memory controller 600 and a memory module 605 is shown, in accordance with some embodiments of the present disclosure. When the memory controller 600 desires to establish communication with the memory module 605, the memory controller asserts a CEN signal 610A to enable the memory module 605 to start responding to the control signals received after the CEN signal. The memory controller 600 also transmits a CLE signal 610B, an ALE signal 610C, a WEN signal 610D, an I/O signal 610E, and a DQS signal 610F to the memory module 605. Each of these signals is sent via a respective pad on the memory controller 600. Unlike FIG. 3, the embodiment of FIG. 6 does not have a DLE pad to send the command data, address data, or parameter data. Rather and as discussed below, the CLE signal 610B and the ALE signal 610C may be used to transfer the command data, the address data, and the parameter data to the memory module 605 in parallel with I/O data on the I/O signal 610E. The WEN signal 610D is similar to the WEN signal 310D and the I/O signal 610E is similar to the I/O signal 310F. The DQS signal 610F is similar to the DQS signal 310G and used for transmitting data between the memory controller 600 and the memory module 605.

The memory module 605 receives the various control signals from the memory controller 600 via pads on the memory module before diverting those signals to appropriate logic blocks within the memory module. Thus, the memory module 605 receives the CEN signal 610A from the memory controller 600 as CEN signal 610G, the CLE signal 610B as CLE signal 610H, the ALE signal 610C as ALE signal 610I, the WEN signal 610D as WEN signal 610J, the I/O signal 610E as I/O signal 610K, and the DQS signal 610F as DQS signal 610L. The I/O data being sent via the I/O signal 610E and the I/O signal 610K is sent to a latch module 615 within the memory module 605 for temporary storage before being transmitted as I/O data 620 to a logic block 625, and particularly to a datapath block 630 of that logic block, for writing the I/O data within the memory module for a write command. For a read command, the datapath block 630 may also be used to transfer the data being read from the memory module 605 to the I/O data 620, which may optionally be temporarily stored within the latch module 615 before being sent to the memory controller 600 via the I/O signal 610E. The latch module 615, the logic block 625, and the datapath block 630 are similar to the latch module 315, the logic block 325, and the datapath block 330, respectively.

The CLE signal 610H, the ALE signal 610I, and the WEN signal 610J are directed to a logic block 635 of the memory module 605. In some embodiments, the CLE signal 610H and the ALE signal 610I may be diverted to the logic block 635 via a CLE/ALE driver 640. In other embodiments, the CLE signal 610H and/or the ALE signal 610I may be directly diverted to the logic block 635, and in some embodiments, the WEN signal 610J may also be diverted to that logic block via a driver module. The logic block 635 is described in greater detail in FIG. 7 below. The logic block 635 generates a data input ("DIN") 645, which is transmitted to the logic block 625, and particularly to a decoding block 650 of that logic block to decode the various commands from the memory controller 600 and write the I/O data 620 into the memory module 605 or read data from the memory module.

Further, the logic block 635 converts the CLE signal 610H, the ALE signal 610I, and the WEN signal 610J into a form that is understood by the decoding block 650. Thus, in addition to the DIN 645, the logic block 635 generates a first modified clock signal 655 for the command and address control signals and a second modified clock signal 660 for control signal for parameter data. The first modified clock signal 655 is similar to the first modified clock signal 355, while the second modified clock signal 660 is similar to the second modified clock signal 360. The first modified clock signal 655 and the second modified clock signal 660, as well as the CLE signal 610B and the ALE signal 610C are diverted to a delay block 665. The delay block 665 is similar to the delay block 365. The delay block 665 generates a modified CLE signal 670A, a modified ALE signal 670B, a modified command/address clock 670C via a block 665A, and a modified parameter data clock 670D via a multiplexer 665B, all of which are input into the decoding block 650 for performing the operation requested by the memory controller 600.

Figure 7:
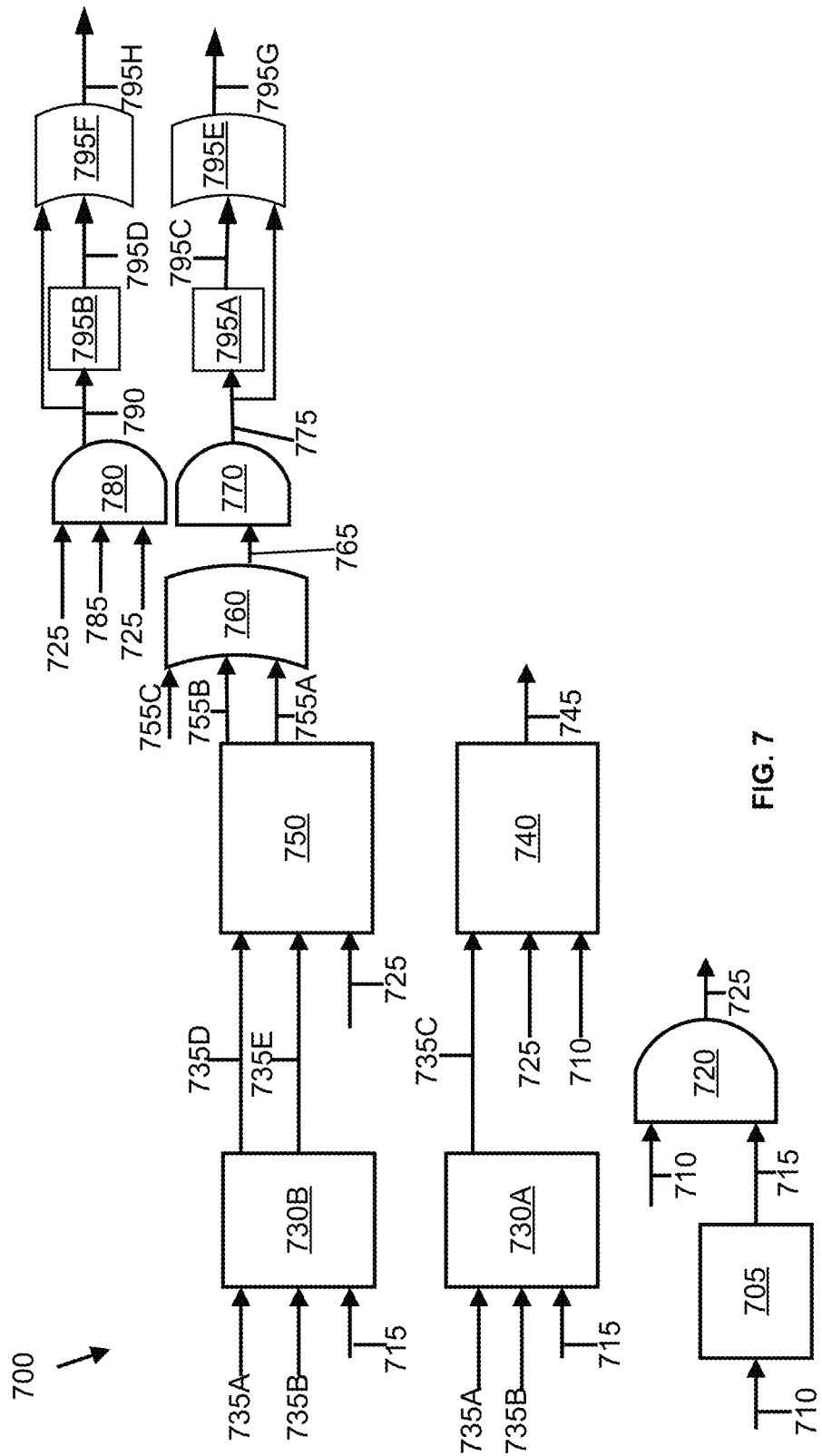
FIG. 7 is an example logic block diagram of a logic block associated with the memory module of FIG. 6, in accordance with some embodiments of the present disclosure.

Turning to FIG. 7, an example logic block diagram 700 is shown, in accordance with some embodiments of the present disclosure. The logic block diagram 700 shows elements of the logic block 635 of FIG. 6. The logic block diagram 700 includes a counter 705 that receives a WEN signal 710 as input and generates a transition signal 715 as output. The WEN signal 710 is similar to the WEN signal 410 and 610I. The counter 705 is similar to the counter 405. Thus, the counter 705 is configured to count clock pulses of the WEN signal 710 and generate the transition signal 715 upon counting a designated number of pulses.

In some embodiments, the command data, address data, or parameter data may be transmitted through the CLE and ALE signals (e.g., the CLE signal 610H, the ALE signal 610I). Thus, the CLE and ALE signals may be used for sending both command data/address data/parameter data as well as control signals indicating whether the CLE and ALE signals are sending command data or address data or parameter data. The CLE and ALE signals may include a header portion that is sent before the command data or the address data or the parameter data is sent. The header portion corresponds to the control signal portion of the CLE and ALE signals. In some embodiments, the header portion may be sent in one pulse of the WEN signal 710. In other embodiments, the header portion may be sent in multiple pulses of the WEN signal 710. Upon receiving the header portion, the counter 705 may start counting the pulses of the WEN signal 710. In some embodiments, both the CLE and ALE signals may be used to transmit command data/address data/parameter data. In such cases, if an eight bit value is to be sent, four bits may be sent on the CLE signal and four bits may be sent on the ALE signal. Further, since each bit of data may be sent during one pulse of the WEN signal 710, sending eight bits of data (four bits on the CLE signal and four bits on the ALE signal) would require four pulses of the WEN signal. Thus, the counter 705 may toggle the transition signal 715 upon receiving the header portion, then count four pulses after the header portion, and toggle the transition signal again after the four pulses.

The transition signal 715 may be combined with the WEN signal 710 via an AND gate 720 to generate a WEN derivative ("WEND") signal 725. The WEND signal 725 is a trigger for other elements of the logic block diagram 700 to generate other signals. The AND gate 720 may be implemented in accordance with Truth Table 2 above such that the AND gate 720 outputs a logic HIGH level (e.g., logic level "1") only when all the inputs to the AND gate are also at a logic HIGH level. If any of the inputs to the AND gate 720 is at a logic LOW level (e.g., logic level "0"), the output of the AND gate is a logic LOW level. Thus, the WEND signal 725 is at a logic HIGH level when both the WEN signal 710 and the transition signal 715 are also at a logic HIGH level, while the WEND signal is at a logic LOW level when either of the WEN signal or the transition signal is at a logic LOW level.

The logic block diagram 700 also includes a latch 730A and a decoder 730B. The latch 730A may be used to temporarily store the bits being sent on the CLE and ALE signals. Thus, the latch 730A receives a CLE signal 735A and an ALE signal 735B as input and stores the bits therein. The latch 730A may be implemented in any way that is suitable. The latch 730A may generate a data 735C, which is input into a SIPO block 740. The transition signal 715 may also be input into the latch 730A to indicate that the entire sequence of the eight bits have been received. In some embodiments, upon receiving the transition signal, the latch 730A may delete the data stored therein and wait to receive the next set of eight bits from the CLE signal 735A and the ALE signal 735B.

The decoder 730B is used to decode the header portion of the CLE signal 735A and the ALE signal 735B. In some embodiments, the decoder 730B may decode the header portion by implementing Truth Table 1 above. Thus, based upon the logic levels of the CLE signal 735A and the ALE signal 735B in the header portion, the decoder 730B may determine whether the data sent on the CLE signal and the ALE signal immediately after the header portion is a command data or address data or parameter data. Thus, the header portion provides the control signals for the CLE signal 735A and the ALE signal 735B. For example, if the CLE signal 735A is at a logic LOW level in the header portion and the ALE signal 735B is also at a logic LOW level in the header portion, the decoder 730B may determine that the data that comes next on those signals is parameter data. If the CLE signal 735A is at a logic LOW level and the ALE signal 735B is at a logic HIGH level in the header portion, the decoder 730B may determine that the data that comes next on those signals is address data, while if the CLE signal 735A is at a logic HIGH level and the ALE signal 735B is at a logic LOW level in the header portion, the decoder may determine that the data that comes next on those signals is command data. If the CLE signal 735A is at a logic HIGH level and the ALE signal 735B is also at a logic HIGH level in the header portion, the decoder 730B may determine that I/O data is to be written to the memory module or I/O data is being read form the memory module, which is to be transmitted on an I/O signal. Thus, the decoder 730B does not expect any data to come through via the CLE signal 735A and the ALE signal 735B. The logic circuit of the decoder 730B is discussed in greater detail in FIG. 8 below. The decoder 730B may also receive the transition signal 715 as input. The toggling of the transition signal 715 may enable the decoder 730B to distinguish between the header portion and the command data/address data/parameter data on the CLE signal 735A and the ALE signal 735B.

Upon decoding the header portion of the CLE signal 735A and the ALE signal 735B, the decoder 730B generates a command signal 735D and an address signal 735E. The command signal 735D may be at the same logic level as the CLE signal 735A, while the address signal 735E may be at the same logic level as the ALE signal 735B. Further, the decoder 730B may continue to generate the command signal 735D and the address signal 735E until the next header portion is received indicated by the toggling of the transition signal 715.

The data 735C from the latch 730A is transmitted to a SIPO block 740. The SIPO block 740 is similar to the SIPO block 430 in that the SIPO block 740 receives data in serial and outputs the data in parallel. The SIPO block 740 also receives the WEND signal 725 and the WEN signal 710 as inputs. Via the data 735C, the SIPO block 740 receives pairs of bits that are sent via the CLE signal 735A and the ALE signal 735B. Since the WEND signal 725 is generated after four clock pulses of the WEN signal 710, by the time the WEND signal is generated, the SIPO block 740 has received four bit pairs from the latch 730A. Upon receiving the WEND signal 725, the SIPO block 740 converts the four bit pairs into a parallel eight bit data input ("DIN") 745. The DIN 745 is similar to the DIN 645, which is sent to the decoding block 650 of the logic block 625.

The command signal 735D and the address signal 735E from the decoder 730B are input into a flip flop 750. The flip flop 750 also receives the WEND signal 725. The flip flop 750 is similar to the flip flop 435. Thus, the flip flop 750 may be used to latch or temporarily store the command signal 735D and the address signal 735E, and generate a derivative ALE signal 755A and a derivative CLE signal 755B, which are input into a logical OR gate 760 along with a parameter data signal 755C. The OR gate 760 is similar to the OR gate 475. Thus, the OR gate 760 generates an output signal 765 that enables generation of a clock signal for the logic block 625 only when either command data, or address data, or parameter data is to be sent to that logic block. The OR gate 760 is implemented in accordance with Truth Table 3 above. Thus, the OR gate 760 generates a logic HIGH level (e.g., logic level "1") output when at least one of the inputs are at a logic HIGH level, and generates a logic LOW level (e.g., logic level "0") when all of the inputs are at logic LOW levels. Thus, the output signal 765 is at a logic HIGH level when at least one of the derivative ALE signal 755A, the derivative CLE signal 755B, or the parameter data signal 755C are at a logic HIGH level. The output signal 765 is at a logic LOW level when all of the derivative ALE signal 755A, the derivative CLE signal 755B, and the parameter data signal 755C are at a logic LOW level.

The output signal 765 is input into a logic AND gate 770 along with the WEND signal 725. The AND gate 770 is implemented using the Truth Table 2 above. Thus, when the WEND signal 725 transitions to a logic HIGH level and when command data, address data, or parameter data are being sent to the logic block 625 indicative by the output signal 765 being at a logic HIGH level, the AND gate 770 generates a first modified clock signal 775. The first modified clock signal 775 is similar to the first modified clock signal 655. The WEND signal 725 is also input into a logic AND gate 780 along with a parameter data signal 785. The AND gate 780, which is implemented in accordance with the Truth Table 2 above, generates a second modified clock signal 790 when the WEND signal 725 and the parameter data signal 785 are both at logic HIGH levels. The second modified clock signal 790 is similar to the second modified clock signal 660.

The first modified clock signal 775 is input into a delay block 795A and the second modified clock signal 790 is input into a delay block 795B. The delay block 795 is similar to the delay block 485A and the delay block 795B is similar to the delay block 485B. The delay block 795A and the delay block 795B are used to increase a pulse width of the first modified clock signal 775 and the second modified clock signal 790, respectively. The delay block 795A generates a first increased width signal 795C and the delay block 795B generates a second increased width signal 795D. The first increased width signal 795C is input into an OR gate 795E along with the first modified clock signal 775, while the second increased width signal 795D is input into an OR gate 795F along with the second modified clock signal 790. The OR gate 795E and the OR gate 795F may be implemented in accordance with Truth Table 3 above, but with to inputs instead of three. The output from the OR gate 795E is a first modified signal 795G having an increased pulse width and the output from the OR gate 795F is a second modified signal 795H having an increased pulse width.

Figure 8:
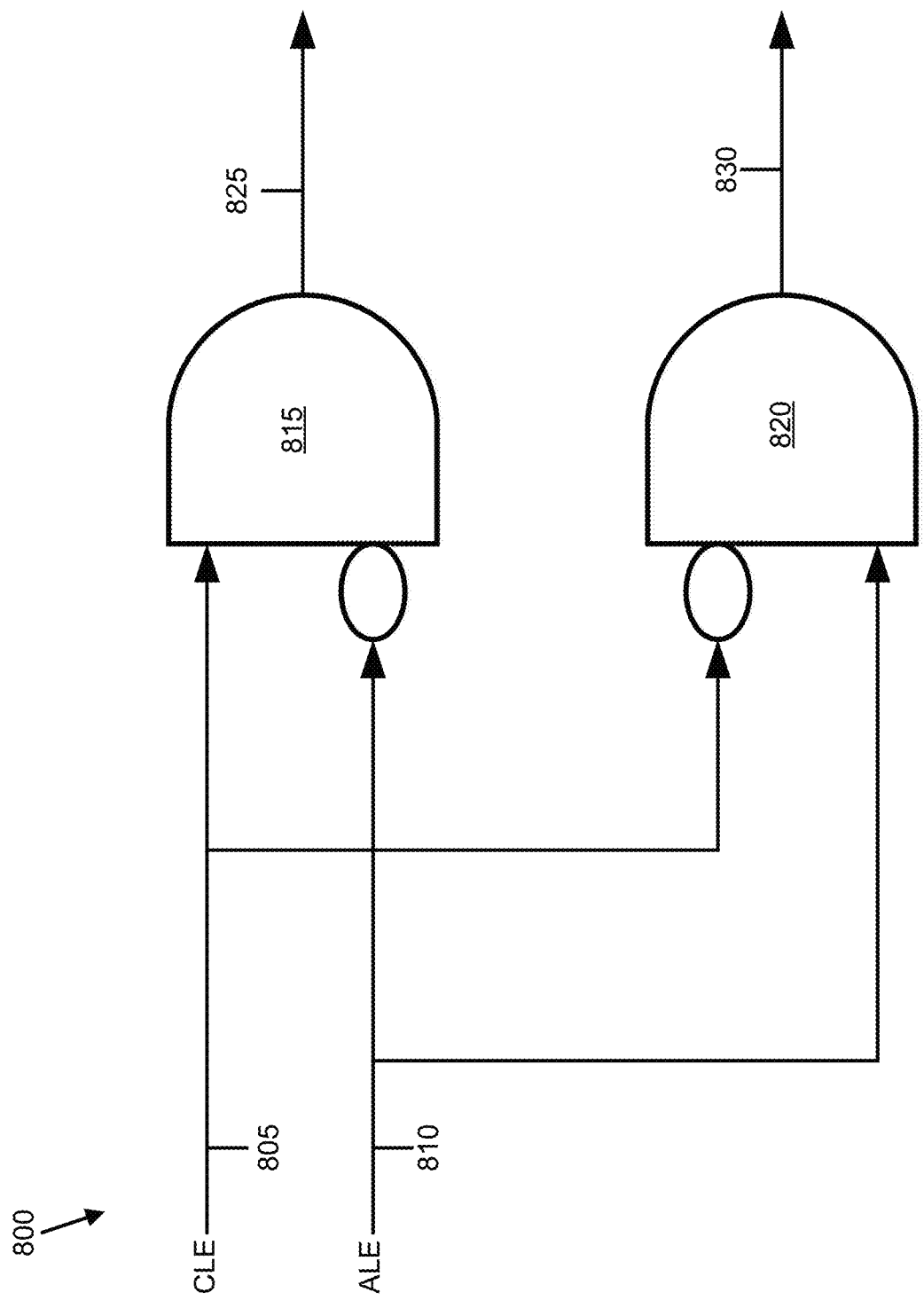
FIG. 8 is an example logic diagram of a decoder used in the logic block diagram of FIG. 7, in accordance with some embodiments of the present disclosure.

Referring now to FIG. 8, a logic circuit of a decoder 800 is shown, in accordance with some embodiments of the present disclosure. The decoder 800 is similar to the decoder 730B. The decoder 800 receives a CLE signal 805 and an ALE signal 810 as inputs into a first AND gate 815 and a second AND gate 820. The ALE signal 810 is inverted before being input into the first AND gate 815. Similarly, the CLE signal 805 is inverted before being input into the second AND gate 820. The CLE signal 805 is similar to the CLE signal 735A, while the ALE signal 810 is similar to the ALE signal 735B. The first AND gate 815 and the second AND gate 820 are implemented in accordance with Truth Table 2 above such that the outputs of the first AND gate and the second AND gate are at a logic HIGH level only when all the inputs into their respective gates are at a logic HIGH level.

The decoder 800 may generate a command signal 825 from the first AND gate 815 and an address signal 830 from the second AND gate 820. The command signal 825 is similar to the command signal 735D and the address signal 830 is similar to the address signal 735E. The decoder 800 may be implemented in accordance with the Truth Table 4 below:

| Truth Table 4 | | | |
|---|---|---|---|
| CLE | ALE | Command | Address |
| 0 | 0 | 0 | 0 |
| 0 | 1 | 0 | 1 |
| 1 | 0 | 1 | 0 |
| 1 | 1 | INVALID | INVALID |

Figure 9A:
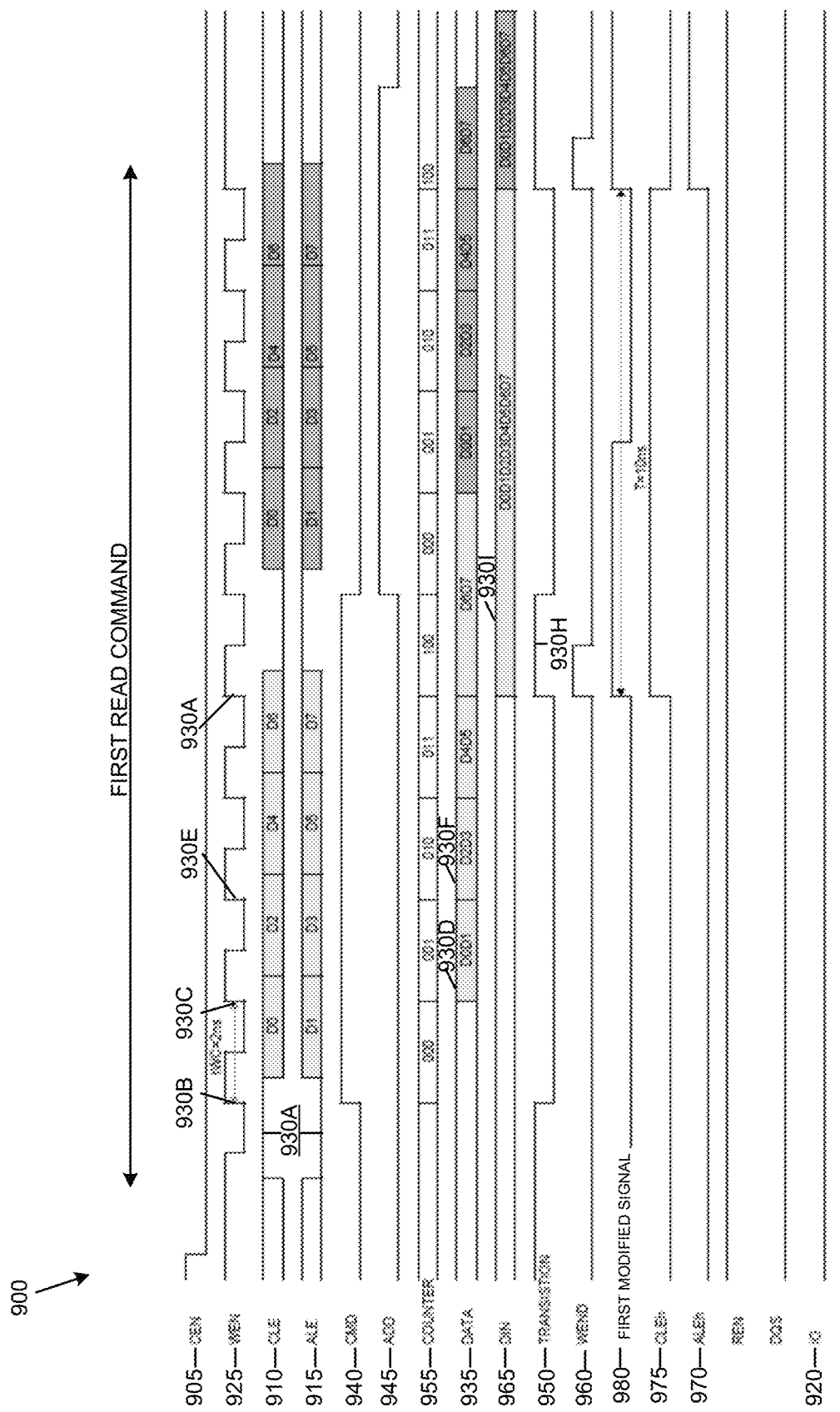
FIGS. 9A and 9B are example timing diagrams showing communication between the memory controller and the memory module of FIGS. 6-8 in a first mode, in accordance with some embodiments of the present disclosure.
Figure 9B:
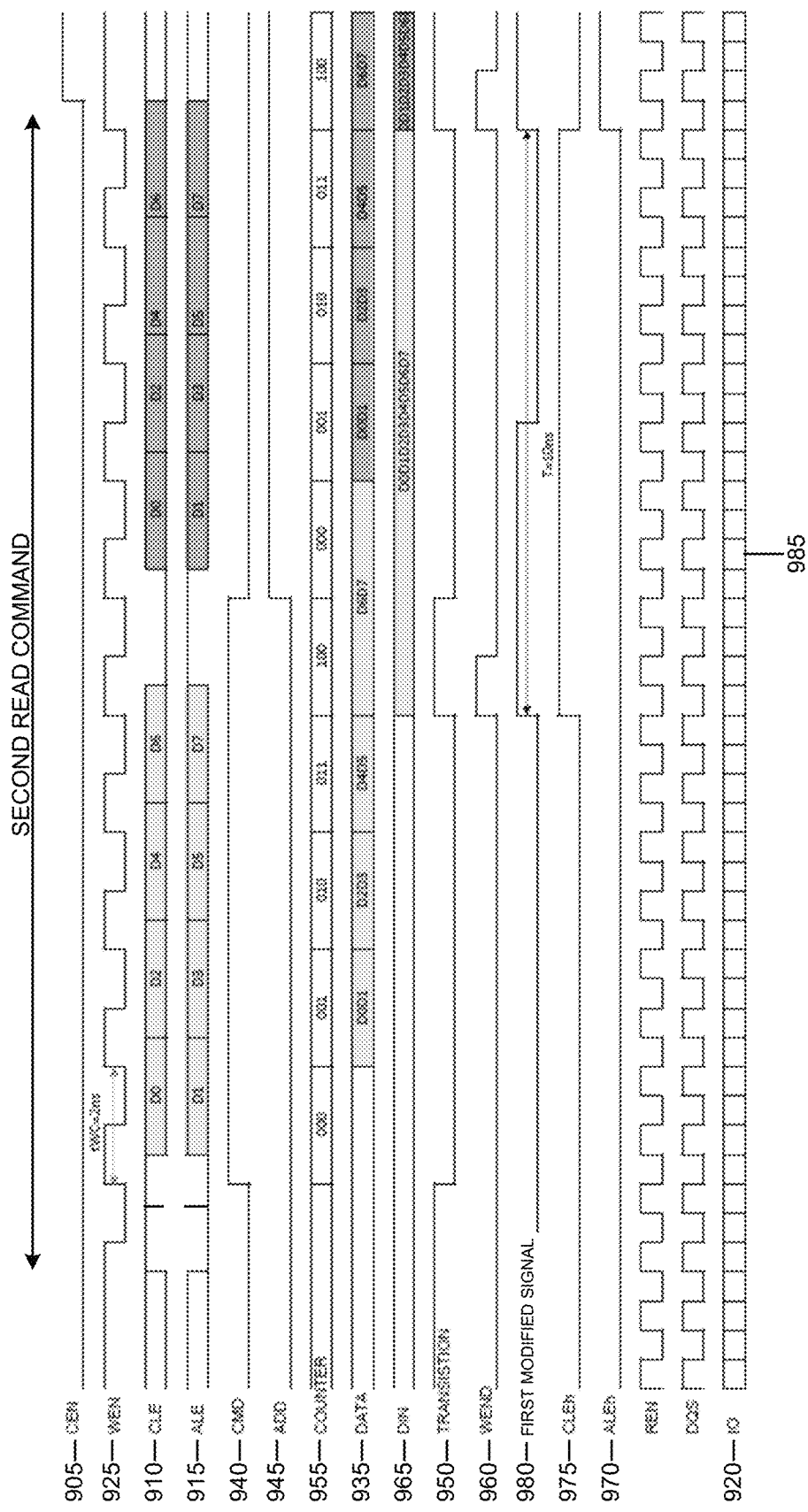

Referring to FIGS. 9A and 9B, a timing diagram 900 is shown, in accordance with some embodiments of the present disclosure. The timing diagram 900 is implemented by the logic block diagram 700 of FIG. 7. Thus, the timing diagram 900 is discussed in conjunction with FIG. 7. Further, FIGS. 9A and 9B show portions of the timing diagram 900. Thus, the timing diagram portion shown in FIG. 9B is a continuation of the timing diagram portion shown in FIG. 9A. The timing diagram 900 has been split into the timing diagram portions of FIGS. 9A and 9B simply for legibility. Further, for purposes of explanation, the timing diagram 900 is for a read command. The timing diagram portion of FIG. 9A corresponds to a first read command, while the timing diagram portion of FIG. 9B corresponds to a second read command. Thus, no I/O data is sent by the memory controller. Rather, as shown in FIG. 9B, I/O data is received from the memory module by the memory controller.

Figure 12:
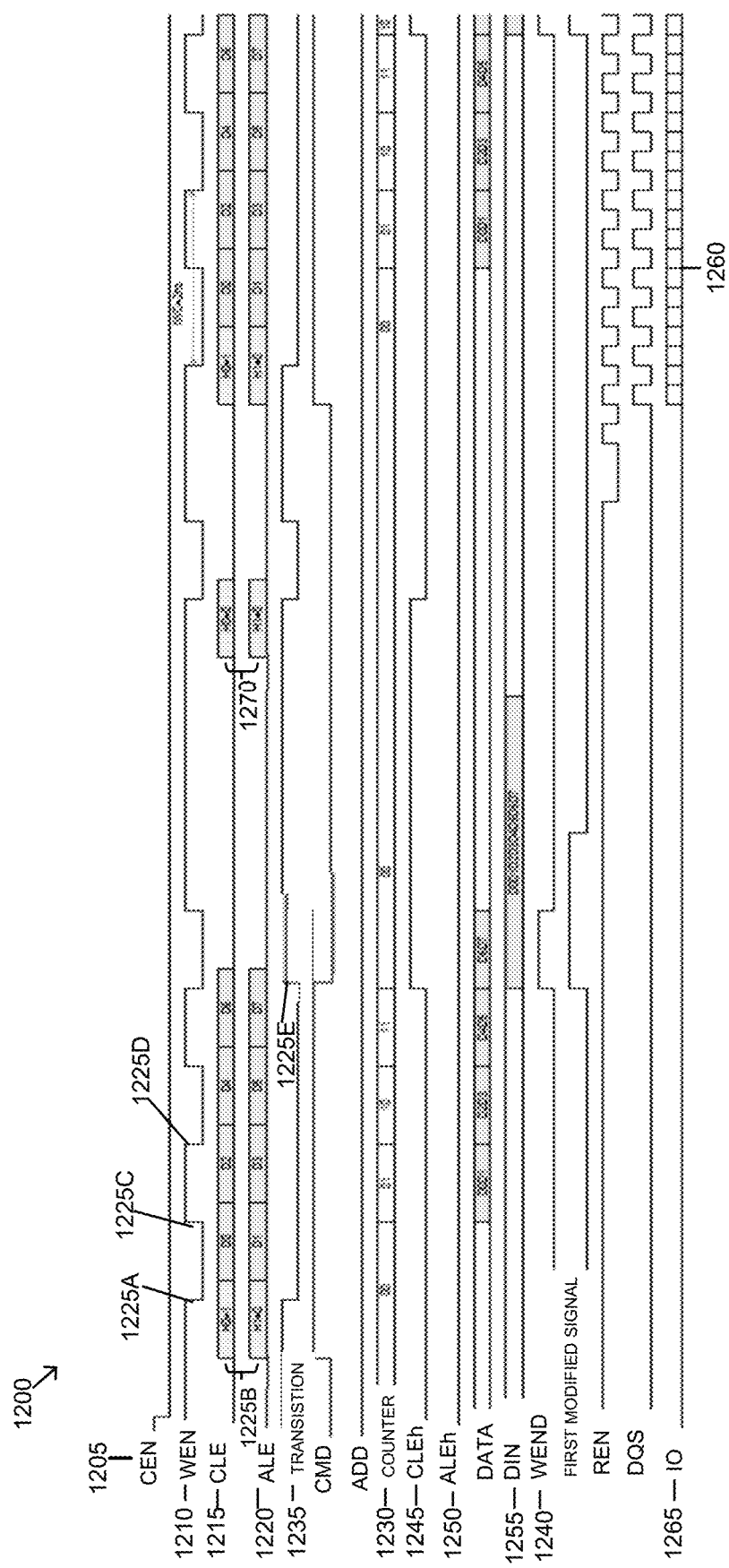
FIG. 12 is an example timing diagram showing communication between the memory controller and the memory module of FIGS. 6-8 in a second mode, in accordance with some embodiments of the present disclosure.

The timing diagram 900 includes a CEN signal 905, a CLE signal 910, an ALE signal 915, an I/O signal 920, and a WEN signal 925. In some embodiments, each of the CEN signal 905, the CLE signal 910, the ALE signal 915, and the WEN signal 925 may be one-bit wide signals, while the I/O signal 920 may be eight bits wide. In some embodiments and as shown in the timing diagram 900, the WEN signal 925 is an active low signal. Further, the timing diagram 900 is shown according to an SDR mode in which various transitions discussed below are with respect to a rising edge of the WEN signal 925. In some embodiments, the various transitions may be with respect to the falling edge of the WEN signal 925 in the SDR mode. Alternatively, the timing diagram 900 may be modified for a DDR mode in which the transitions occur at the rising and the falling edge of the WEN signal 925 doubling throughput relative to the SDR mode. A timing diagram for DDR mode is shown in FIG. 12 below.

To activate the memory module (e.g., the memory module 605), the memory controller (e.g., the memory controller 600) asserts a CEN signal, which is received at the memory module as the CEN signal 905. Since the CEN signal 905 is an active low signal, the CEN signal is at a logic HIGH level by default. When the memory module is desired to be activated, the memory controller toggles the CEN signal 905 to a logic LOW level. The CEN signal 905 remains in the logic LOW level until the operation being performed in the memory module is complete. Once the operation being performed in the memory module is complete, the memory controller toggles the CEN signal back to the default state of logic HIGH level. When the CEN signal 905 is asserted (e.g., is at a logic LOW level), the memory module starts responding to the CLE signal, the ALE signal, and the WEN signal received from the memory controller.

During the first pulse of the WEN signal 925, the CLE signal 910 and the ALE signal 915 send a header portion 930A. The header portion 930A shows the CLE signal 910 in a logic HIGH level and the ALE signal 915 in a logic LOW level. Upon receiving the CLE signal 910 and the ALE signal 915, the decoder 730B may decode those signals in accordance with Truth Table 1 above and determine that the header portion corresponds to a command control signal. Thus, the decoder 730B may determine that the data sent on the CLE signal 910 and the ALE signal 915 after the header portion 930A is command data to correspond with the command control signal. Thus, after a first rising edge 930B of the WEN signal 925, the CLE signal 910 and the ALE signal 915 each start sending command data bits—one bit during each clock pulse of the WEN signal 925. For example, during the first pulse after the header portion 930A, the CLE signal 910 may send a bit, D0, while the ALE signal 915 may send a bit, D1, during the same pulse. Each bit sent via the CLE signal 910 and the ALE signal 915 in one pulse is latched within the latch 730A at the next rising edge of the WEN signal 925.

The output of the latch is shown in the timing diagram as a data signal 935. Thus, the bits D0 and D1 are latched within the latch 730A after a rising edge 930C of the WEN signal 925 as data bits 930D, bits D2 from the CLE signal 910 and D3 from the ALE signal 915 are latched after a rising edge 930E of the WEN signal 925 as data bits 930F, and so on. Further, the decoder 730B generates a command signal 940 and an address signal 945 upon a toggling of a transition signal 950 generated by a counter 955. At the rising edge 930B of the WEN signal 925, the counter 955 starts counting the WEN clock pulses. Since two bits (one bit on the CLE signal 910 and another bit on the ALE signal 915) are being sent on each pulse of the WEN signal 925, the counter 955 counts four pulses after the rising edge 930B. At a fifth rising edge 930G, the counter toggles the transition signal 950. Thus, at the fifth rising edge 930G, the transition signal 950 transitions to a HIGH logic level for one pulse 930H. After the one pulse 930H, the transition signal 950 toggles back to the LOW logic state and remains in the LOW logic state until the counter 955 counts four pulses of the WEN signal 525. The transitioning of the transition signal 950 to the logic HIGH level toggles a WEND signal 960 for half a pulse. The WEND signal 960 is similar to the WEND signal 725.

The data signal 935, along with the WEND signal 960 and the WEN signal 925 are input into the SIPO block 740, which combines the four bit pairs from the data signal into an eight bit DIN signal 965, as indicated by portion 9301. The DIN signal 965 is similar to the DIN 745. Additionally, the toggling of the WEND signal 960 to the logic HIGH level triggers the flip flop 750 for generating a derivative ALE signal 970 and a derivative CLE signal 975. Since the ALE signal 915 and the CLE signal 910 are sending command data bits after the header portion 930A, the logic levels of the ALE and CLE signals from the header portion are recreated by the flip flop 750 to generate the derivative ALE signal 970 and the derivative CLE signal 975. The derivative ALE signal 970 and the derivative CLE signal 975 have the same logic levels as the ALE signal 915 and the CLE signal 910, respectively.

In addition, toggling of the WEND signal 960 to the logic HIGH level triggers the generation of the first modified clock signal 775 and the second modified clock signal 790, as well as the first modified signal 795G and the second modified signal 795H. Only the first modified 795G is shown in in the timing diagram 900 as signal 980. The one pulse of the signal 980 is equal to the total duration of the five pulses (one pulse for the header portion 930A and four pulses for the command data) of the WEN signal 925. Further, the one pulse of the signal 980 has a duty cycle that is half of five times the duty cycle of each pulse of the WEN signal 925.

Further, while the command data, address data, or parameter data is being transmitted by the CLE signal 910 and the ALE signal 915, the I/O signal 920 may be used to send data that needs to be written to the memory module or read from the memory module. FIG. 9B shows a data out operation during reading of data from the memory module. Thus, as shown in FIG. 9B, the memory controller may start sending a second read command while I/O data 985 for the first read command is transmitted by the memory module on the I/O signal 920. Thus, by using the CLE signal 910 and the ALE signal 915, at least some of the time needed to send command data, address data, or parameter data may be shielded or hidden with the time needed to send I/O data via the I/O signal 920 to increase data transfer rates, thereby increasing performance.

Turning to FIGS. 10A-10C, example timing diagrams 1000A, 1000B, and 1000C illustrating an application of sending command data/address data/parameter data in parallel with I/O data is shown, in accordance with some embodiments of the present disclosure. The timing diagrams 1000A-1000C show a multi-die (e.g., each die having multiple memory modules) read operation for a low latency flash memory. FIG. 10A shows a problem associated with completing a read command in each of four dies, Die 0, Die 1, Die 2, and Die 3 in parallel. Completing a read command by a die may include multiple read command portions. For example, to read data from Die 0, the associated memory controller first sends a read command portion 1005A (e.g., a read control signal and corresponding command/address/parameter data). Upon receiving the read command portion 1005A, Die 0 starts decoding the read command portion 1005A for reading data. The internal time for the memory module to decode the read command portion 1005A and read the data is shown as read time 1010A. The memory controller may be aware of the duration of the read time 1010A. After the lapse of the read time 1010A, the memory controller may issue a data out command 1015A to the memory module to receive the data read by the memory module during the read time 1010A. Upon receiving the data out command 1015A, the memory module may decode the data out command 1015A during time period 1020A and start the data out operation during time period 1025A.

Similarly, to read data from Dies 1-3, the memory controller may issue a read command that includes the read command portion 1005A, the read time 1010A, the data out command 1015A, and the time period 1020A for decoding the data out command, and the time period 1025A for transferring the data. The memory controller may stagger the sending of the read command portion 1005A and the data out command 1015A on the Dies 0-3, such that those commands are sent while the memory module is decoding those signals and the I/O signal is available to send the commands. For example, the memory controller may send the read command portion 1005A on Die 1 during the read time 1010A of Die 0. Thus, during the read time 1010A of Die 0, the I/O signal is available to send the read command portion 1005A on Die 1. Similarly, when the memory controller sends the read command portion 1005A on Die 2, both Dies 0 and 1 are during the read time 1010A and the I/O signal is available to send the read command portion on Die 2. When the memory controller sends the read command portion 1005A on Die 3, Dies 0-2 are in the read time 1010A.

Likewise, when the memory controller sends the data out command 1015A on Die 1, Die 0 is decoding the data out command during the time period 1020A and the I/O signal is available. Similarly, the I/O signal is available when the memory controller sends the data out command 1015A on Die 2 because that die is during the time period 1020A of decoding the data out command. Thus, the memory controller may issue the read command portion 1005A and the data out command 1015A in parallel on Dies 0-2.

However, during the time period 1025A when Die 0 is transferring data to the memory controller via the I/O signal, the memory controller is unable to send any further commands on Dies 1-3 on the I/O signal in conventional mechanisms. Thus, the memory controller is unable to send the data out command 1015A on Die 3, which coincides with the data transfer on Die 0 since conventionally command data and I/O data use the same I/O signal. Therefore, the memory controller is able to either send the data out command 1015A on the I/O signal on Die 3 or receive the data from Die 0 during overlapping time period 1030. Thus, FIG. 10 shows a problem with reading data on multiple dies in parallel in conventional mechanisms. To get around the above problem, the memory controller in conventional mechanisms needs to wait until the data out operation on Die 0 is complete before issuing a command on Die 3. In fact, if the data out operations from Dies 1 and 2 overlap with the sending of the commands for Die 3, the memory controller may need to wait until the data out operations from Dies 1 and 2 are complete as well, as shown in FIG. 10B. Similarly, Die 1 needs to wait until the data out operation on Die 0 is complete before beginning its data transfer, as indicated by waiting time period 1035.

Thus, as shown in FIG. 10B, the memory controller waits to issue the data out command 1015A on Die 3 until after the data out operation during the time period 1025A is complete on Dies 0-2. Therefore, the conventional mechanisms of reading data in a low latency flash memory have reduced throughput. To increase throughput, the command data and I/O data may be sent in parallel as discussed in the present disclosure. Specifically and as shown in FIG. 10C, by using the present disclosure, the memory controller may issue the data out command 1015A on Die 3 while the I/O data is being read from Die 0 during the time period 1025A on Die 0. This is because the command data may be sent in parallel to the I/O data using the present disclosure, thereby increasing throughput.

Figure 11:
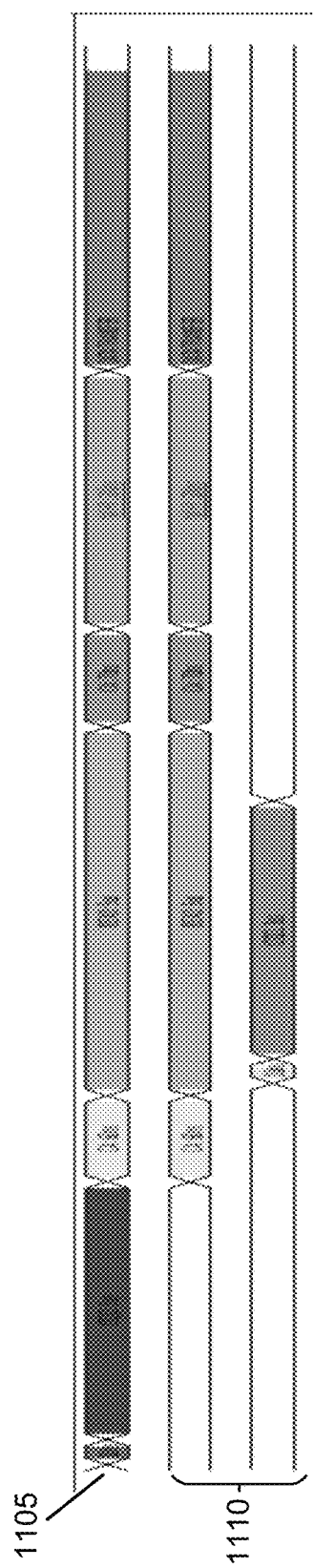
FIG. 11 is an example timing diagram showing another application of the embodiments of FIGS. 3-9B, in accordance with some embodiments of the present disclosure.

Turning to FIG. 11, a timing diagram 1100 is shown, in accordance with some embodiments of the present disclosure. Generally speaking, certain sequences such as a ZQ calibration sequence may be run on memory modules from time to time. Running these calibration sequences require sending commands from the memory controller to the memory module being calibrated. When the calibration sequence commands are being sent, data cannot be sent to or received from the memory module in conventional mechanisms because they use the same I/O signal to transfer both commands and I/O data, as shown in timing diagram 1105. However, using the teachings of the present disclosure, the memory controller may send calibration sequence commands and I/O data in parallel, as shown by timing diagram 1110, thereby improving throughput.

Referring to FIG. 12, an example timing diagram 1200 is shown, in accordance with some embodiments of the present disclosure. The timing diagram 1200 is similar to the timing diagram 900 but in a DDR mode. Thus, data is latched at every edge (e.g., rising edge and falling edge) of a clock signal. Thus, when a CEN signal 1205 toggles to a logic LOW level, a WEN signal 1210, a CLE signal 1215, and an ALE signal 1220 are asserted. Since the operation is in DDR mode, at a first edge 1225A of the WEN signal 1210, header information 1225B is sent by the CLE signal 1215 and the ALE signal 1220. After the header information 1225B, the CLE signal 1215 and the ALE signal 1220 start sending bits of command data/address data/parameter data, which is latched after every rising or falling edge of the WEN signal 1210. For example, bits D0 and D1 are latched after an edge 1225C of the WEN signal 1210, bits D2 and D3 are latched after edge 1225D of the WEN signal, and so on.

Further, a counter 1230 may count each edge of the WEN signal 1210 instead of counting pulses as in the SDR mode. Thus, upon counting five toggling edges (one edge for the header information 1225B and four edges for the data bits D0-D7), the counter 1230 toggles a transition signal 1235, as indicated by edge 1225E. Further, the transition signal 1235 toggles a WEND signal 1240. The toggling of the WEND signal 1240 triggers the generation of a derivative CLE signal 1245, derivative ALE signal 1250, and DIN 1255, in a similar manner as discussed above.

Thus, the present disclosure provides a mechanism to send command data/address data/parameter data in parallel with I/O data, thereby increasing performance and throughput.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances, where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A memory device comprising:
   a memory controller having programmed instructions to:
      transmit or receive input/output ("I/O") data via an I/O signal through one or more I/O pads;
      transmit command data, address data, or parameter data serially via another signal through another pad in parallel with transmitting or receiving the I/O data through the one or more I/O pads; and
   a memory module communicably coupled to the memory controller, wherein the memory module is configured to receive the command data, address data, or parameter data from the memory controller and convert the serial command data, address data, or parameter data to parallel data to perform an operation.

2. The memory device of claim 1, wherein the memory controller transmits the command data, the address data, or the parameter data to the memory module via a data latch enable ("DLE") signal.

3. The memory device of claim 2, wherein the memory controller further transmits:
   a command latch enable ("CLE") signal; and
   an address latch enable ("ALE") signal,
   wherein the CLE signal and the ALE signal are control signals indicative of whether the DLE signal is transmitting the command data, the address data, or the parameter data.

4. The memory device of claim 1, wherein:
   the one or more I/O pads consist of eight first I/O pads and the other pad is a first DLE pad for transmitting the DLE signal to the memory module; and
   the memory module comprises a second DLE pad for receiving the DLE signal from the memory controller and eight second I/O pads for receiving or transmitting the I/O signal.

5. The memory device of claim 1, wherein the memory controller is configured to send the command data, the address data, or the parameter data serially in 1-bit increments.

6. The memory device of claim 5, wherein:
   the memory module comprises a counter to count a number of pulses of a clock signal received from the memory controller, each of the 1-bit increments being sent by the memory controller with respect to a pulse of the clock signal;
   the counter generates a transition signal upon counting the number of pulses; and
   the memory module converts the serially received 1-bit increments into parallel data upon receiving a modified clock signal generated based upon the transition signal.

7. The memory device of claim 1, wherein:
   the operation comprises a first read operation and a second read operation; and
   the memory controller receives the I/O data from the memory module via the I/O signal for the first read operation in parallel with sending a command for the second read operation to the memory module.

8. The memory device of claim 1, wherein:
   the memory controller transmits the command data, the address data, or the parameter data via a command latch enable ("CLE") signal and an address latch enable ("ALE") signal; and
   the CLE signal comprises a CLE header and the ALE signal comprises an ALE header, the combination of the CLE header and the ALE header indicative of whether the CLE signal and the ALE signal are transmitting the command data, the address data, or the parameter data.

9. The memory device of claim 8, wherein the CLE signal and the ALE signal transmit the command data when the CLE header is asserted and the ALE header is disabled.

10. The memory device of claim 8, wherein the CLE signal and the ALE signal transmit the address data when the ALE header is asserted and the CLE header is disabled.

11. The memory device of claim 8, wherein the CLE signal and the ALE signal transmit the parameter data when the CLE header is disabled and the ALE header is disabled.

12. The memory device of claim 8, wherein the CLE signal and the ALE signal transmit the CLE header and the ALE header, respectively, before transmitting the command data, the address data, or the parameter data.

13. The memory device of claim 8, wherein the CLE signal and the ALE signal transmit the command data, the address data, or the parameter data serially in 1-bit increments.

14. A non-transitory computer-readable media having computer-readable instructions stored thereon that when executed by a memory module cause the memory module to perform a process comprising:

receiving a first read command from a memory controller;

transferring data to the memory controller as parallel data, via a plurality of data pads, in response to the first read command;

receiving a second read command from the memory controller as serial data, via another pad that is separate from the plurality of data pads, in parallel with transferring the data to the memory controller; and converting the serial data to parallel data of the second read command.

15. The non-transitory computer-readable media of claim 14, wherein receiving the first read command and the second read command comprises:

receiving a clock signal from the memory controller;

receiving a data latch enable ("DLE") signal from the memory controller, wherein the DLE signal transmits command data, address data, or parameter data from the memory controller serially in 1-bit increments with respect to a pulse of the clock signal;

receiving a command latch enable ("CLE") signal and an address latch enable ("ALE") signal indicating whether the DLE signal is transmitting the command data, the address data, or the parameter data;

generating a modified clock signal upon counting the number of pulses; and converting the serially received 1-bit increments into parallel data upon receiving the modified clock.

16. The non-transitory computer-readable media of claim 15, further comprising:

converting the CLE signal into a derivative CLE signal, wherein a logic level of the derivative CLE signal is same as the logic level of the CLE signal; and converting the ALE signal into a derivative ALE signal, wherein the logic level of the derivative ALE signal is same as the logic level of the ALE signal.

17. The non-transitory computer-readable media of claim 14, wherein receiving the first read command and the second read command comprises:

receiving a clock signal from the memory controller;

decoding a header of a command latch enable ("CLE") signal and an address latch enable ("ALE") signal received from the memory controller to determine whether the CLE signal and the ALE signal are transmitting command data, address data, or parameter data after the header, and wherein the CLE signal and the ALE signal transmit the command data, the address data, or the parameter data serially in 1-bit increments with respect to a pulse of the clock signal;

generating a modified clock signal upon counting the number of pulses; and converting the serially received 1-bit increments into parallel data upon receiving the modified clock signal.

18. A non-transitory computer-readable media having computer-readable instructions stored thereon that when executed by a memory controller cause the memory controller to perform a process comprising:

sending a clock signal to a memory module;

sending command data, address data, or parameter data via a data latch enable ("DLE") signal to the memory module with respect to the clock signal, wherein the memory controller sends at least 1 bit of the command data, address data, or parameter data during each pulse of the clock signal;

sending a command latch enable ("CLE") signal and an address latch enable ("ALE") signal indicating that the command data, the address data, or the parameter data is being sent; and receiving input/output ("I/O") data from the memory module via an I/O signal in parallel with sending the command data, the address data, or the parameter data to the memory module.

19. The non-transitory computer-readable media of claim 18, wherein sending the command data, the address data, or the parameter data via the data latch enable ("DLE") signal includes transmitting the command data, the address data, or the parameter data to the memory module serially in 1-bit increments.

20. The non-transitory computer-readable media of claim 18, wherein the process further comprises:

sending a header in the CLE signal and the ALE signal, wherein the header is indicative of whether the CLE signal and the ALE signal are transmitting the command data, the address data, or the parameter data after the header; and receiving the I/O data via an I/O signal in parallel.

* * * * *